US010880062B2

United States Patent
Ly et al.

(10) Patent No.: US 10,880,062 B2
(45) Date of Patent: Dec. 29, 2020

(54) PROVIDING PROTECTION FOR INFORMATION DELIVERED IN DEMODULATION REFERENCE SIGNALS (DMRS)

(71) Applicant: QUALCOMM Incorporated, San Diego, CA (US)

(72) Inventors: Hung Ly, San Diego, CA (US); Tingfang Ji, San Diego, CA (US); Sony Akkarakaran, Poway, CA (US); Haitong Sun, Cupertino, CA (US); Peter Gaal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/981,442

(22) Filed: May 16, 2018

(65) Prior Publication Data

US 2019/0007179 A1     Jan. 3, 2019

Related U.S. Application Data

(60) Provisional application No. 62/527,011, filed on Jun. 29, 2017.

(51) Int. Cl.
*H04W 72/00* (2009.01)
*H04L 5/00* (2006.01)
(Continued)

(52) U.S. Cl.
CPC .......... *H04L 5/0051* (2013.01); *H03M 13/09* (2013.01); *H04L 1/0061* (2013.01); *H04W 72/0466* (2013.01); *H04W 72/042* (2013.01)

(58) Field of Classification Search
CPC . H04L 5/0051; H03M 13/09; H04W 72/0466; H04W 72/042
(Continued)

(56) References Cited

U.S. PATENT DOCUMENTS 8,514,745 B2    8/2013  Roh et al.
8,867,496 B2 * 10/2014  Han ................ H04L 5/001
                                              370/335
(Continued)

FOREIGN PATENT DOCUMENTS

EP    2879451 A1    6/2015
EP    3624371 A1    3/2020
(Continued)

OTHER PUBLICATIONS

Huawei: "Scrambling Sequence for ePDCCH Detection", 3GPP Draft: R1-120993, 3rd Generation Partnership Project (3GPP), Mobile Competence Centre: 650, Route Des Lucioles; F-06921 Sophia-Antipolis Cedex; France, vol. RAN WG1, No. Jeju, Korea; 20120326-20120330, Mar. 20, 2012, XP050599304, [retrieved on Mar. 20, 2012], 4 pages.

(Continued)

*Primary Examiner* — Khoi H Tran
*Assistant Examiner* — B M M Hannan
(74) *Attorney, Agent, or Firm* — Linda G. Gunderson; Holland & Hart LLP

(57) ABSTRACT

Methods, systems, and devices for wireless communication are described. A device—such as a base station or user equipment (UE)—may transmit a demodulation reference signal (DMRS) including signaling information in addition to channel estimation information. To improve reception of the DMRS signaling information, the transmitting device may employ data protection techniques to the signaling information and modify a data payload transmitted in the physical data channel associated with the DMRS. In one aspect, the transmitting device may modify cyclic redundancy check (CRC) bits in the payload to include verification for the signaling information. In another aspect, the transmitting device may determine a scrambling code based (Continued)

on the signaling information, and may scramble the payload based on the scrambling code.

13 Claims, 19 Drawing Sheets

(51) Int. Cl.
*H04L 1/00* (2006.01)
*H03M 13/09* (2006.01)
*H04W 72/04* (2009.01)

(58) Field of Classification Search
USPC .......................................................... 455/450
See application file for complete search history.

(56) References Cited

U.S. PATENT DOCUMENTS

| | | | |
|---|---|---|---|
| 9,479,298 B2 | 10/2016 | Raaf et al. | |
| 9,769,812 B2 | 9/2017 | Chae et al. | |
| 2009/0196366 A1* | 8/2009 | Shen | H04L 5/0053 |
| | | | 375/260 |
| 2012/0020335 A1* | 1/2012 | Yellapantula | H04B 1/7083 |
| | | | 370/336 |
| 2012/0282936 A1* | 11/2012 | Gao | H04L 5/0023 |
| | | | 455/450 |
| 2013/0178220 A1* | 7/2013 | Lee | H04W 72/042 |
| | | | 455/450 |
| 2013/0201932 A1* | 8/2013 | Ko | H04L 1/0061 |
| | | | 370/329 |
| 2013/0226690 A1 | 8/2013 | Gross | |
| 2014/0071936 A1 | 3/2014 | Zhang et al. | |
| 2015/0023265 A1* | 1/2015 | Park | H04B 7/024 |
| | | | 370/329 |
| 2015/0063272 A1* | 3/2015 | Suzuki | H04L 5/0051 |
| | | | 370/329 |
| 2015/0078348 A1* | 3/2015 | Han | H04W 4/70 |
| | | | 370/336 |
| 2015/0155993 A1* | 6/2015 | Berggren | H04L 5/0023 |
| | | | 370/330 |
| 2015/0237604 A1* | 8/2015 | Shi | H04W 76/27 |
| | | | 370/330 |
| 2016/0337157 A1* | 11/2016 | Papasakellariou | H04B 3/232 |
| 2017/0331577 A1* | 11/2017 | Parkvall | H04J 11/0079 |
| 2017/0353269 A1 | 12/2017 | Lin et al. | |
| 2018/0084559 A1* | 3/2018 | Kim | H04B 7/26 |
| 2018/0160410 A1* | 6/2018 | Xia | H04W 72/04 |
| 2018/0167946 A1* | 6/2018 | Si | H04W 72/0486 |
| 2018/0183488 A1* | 6/2018 | Qu | H04W 56/00 |
| 2018/0248642 A1 | 8/2018 | Si et al. | |
| 2019/0013917 A1* | 1/2019 | Nam | H04J 11/0086 |
| 2019/0058620 A1* | 2/2019 | Liu | H04L 27/2613 |

FOREIGN PATENT DOCUMENTS

| | | | | |
|---|---|---|---|---|
| WO | WO-2017031759 A1 | | 3/2017 | |
| WO | WO-2017/020199 A1 | * | 9/2017 | .......... H04W 72/042 |
| WO | WO-2018156300 A1 | | 8/2018 | |

OTHER PUBLICATIONS

Partial International Search Report—PCT/US2018/033248—ISA/EPO—dated Aug. 10, 2018.
International Search Report and Written Opinion—PCT/US2018/033248—ISA/EPO—dated Oct. 8, 2018.

* cited by examiner

PROVIDING PROTECTION FOR INFORMATION DELIVERED IN DEMODULATION REFERENCE SIGNALS (DMRS)

CROSS REFERENCES

The present Application for Patent claims priority to U.S. Provisional Patent Application No. 62/527,011 by Ly et al., entitled "Providing Protection For Information Delivered in DMRS," filed Jun. 29, 2017, assigned to the assignee hereof. The provisional application is incorporated by reference herein.

BACKGROUND

The following relates generally to wireless communication, and more specifically to providing protection for information delivered in demodulation reference signals (DMRS).

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

In some wireless communications systems, a device—such as a base station or UE—may transmit a DMRS containing signaling information, channel estimation information, or both types of information. However, signaling information conveyed by a DMRS may be susceptible to detection errors at the receiving device. If the receiving device incorrectly detects the information in the DMRS, the receiving device may experience processing latency (e.g., system acquisition latency, handover latency, hybrid automatic repeat request (HARQ) retransmission delay, etc.).

SUMMARY

The described techniques relate to improved methods, systems, devices, or apparatuses that support providing protection for information delivered in a DMRS. The described techniques provide for identifying a set of reference signal bits associated with the DMRS and a set of data bits associated with a data transmission. The techniques may provide for calculating a set of cyclic redundancy check (CRC) bits as a function of both the reference signal bits and the data bits. In some cases, the techniques may provide for identifying a scrambling code based on the reference signal bits and scrambling the data bits based on the scrambling code. Further described techniques provide for transmitting the DMRS transmission and the data transmission.

A method of wireless communication is described. The method may include identifying a set of reference signal bits associated with a DMRS transmission and a set of data bits associated with a data transmission. The method may further include calculating a set of CRC bits based at least in part on both the set of reference signal bits and the set of data bits, and transmitting the DMRS transmission and the data transmission with the set of CRC bits.

An apparatus for wireless communication is described. The apparatus may include means for identifying a set of reference signal bits associated with a DMRS transmission and a set of data bits associated with a data transmission. The apparatus may further include means for calculating a set of CRC bits based at least in part on both the set of reference signal bits and the set of data bits, and means for transmitting the DMRS transmission and the data transmission with the set of CRC bits.

Another apparatus for wireless communication is described. The apparatus may include a processor, memory in electronic communication with the processor, and instructions stored in the memory. The instructions may be operable to cause the processor to identify a set of reference signal bits associated with a DMRS transmission and a set of data bits associated with a data transmission. The instructions may be further operable to cause the processor to calculate a set of CRC bits based at least in part on both the set of reference signal bits and the set of data bits, and transmit the DMRS transmission and the data transmission with the set of CRC bits.

A non-transitory computer readable medium for wireless communication is described. The non-transitory computer-readable medium may include instructions operable to cause a processor to identify a set of reference signal bits associated with a DMRS transmission and a set of data bits associated with a data transmission. The instructions may be further operable to cause a processor to calculate a set of CRC bits based at least in part on both the set of reference signal bits and the set of data bits, and transmit the DMRS transmission and the data transmission with the set of CRC bits.

In some examples of the method, apparatus, and non-transitory computer-readable medium described above, the set of reference signal bits comprises a first subset of reference signal bits that may be conveyed with the DMRS transmission and a second subset of reference signal bits that may be conveyed with the data transmission.

In some examples of the method, apparatus, and non-transitory computer-readable medium described above, the set of CRC bits may be calculated based at least in part on the first subset of reference signal bits, the second subset of reference signal bits, and the set of data bits.

Some examples of the method, apparatus, and non-transitory computer-readable medium described above may further include processes, features, means, or instructions for calculating a subset of the set of CRC bits based at least in part on the second subset of reference signal bits and the set of data bits. Some examples of the method, apparatus, and non-transitory computer-readable medium described above may further include processes, features, means, or instructions for masking the subset of the set of CRC bits by the first subset of reference signal bits.

Some examples of the method, apparatus, and non-transitory computer-readable medium described above may further include processes, features, means, or instructions for retrieving a bit string based at least in part on the first subset of reference signal bits. Some examples of the method, apparatus, and non-transitory computer-readable medium described above may further include processes, features, means, or instructions for combining the subset of the set of CRC bits with the bit string using an exclusive or (XOR) function.

Some examples of the method, apparatus, and non-transitory computer-readable medium described above may further include processes, features, means, or instructions for transmitting the first subset of reference signal bits in the DMRS transmission and the second subset of reference signal bits in the data transmission.

Some examples of the method, apparatus, and non-transitory computer-readable medium described above may further include processes, features, means, or instructions for appending the set of CRC bits to the set of data bits.

Some examples of the method, apparatus, and non-transitory computer-readable medium described above may further include processes, features, means, or instructions for receiving configuration signaling indicating a CRC configuration for calculating the set of CRC bits.

Some examples of the method, apparatus, and non-transitory computer-readable medium described above may further include processes, features, means, or instructions for switching from a first CRC configuration for calculating the set of CRC bits to a second CRC configuration for calculating the set of CRC bits.

Some examples of the method, apparatus, and non-transitory computer-readable medium described above may further include processes, features, means, or instructions for switching from the first CRC configuration to the second CRC configuration based at least in part on a size of the set of reference signal bits, a size of the set of data bits, a size of the set of CRC bits, or a combination thereof.

Some examples of the method, apparatus, and non-transitory computer-readable medium described above may further include processes, features, means, or instructions for identifying a scrambling code based at least in part on the set of reference signal bits. Some examples of the method, apparatus, and non-transitory computer-readable medium described above may further include processes, features, means, or instructions for scrambling the set of data bits based at least in part on the identified scrambling code.

In some examples of the method, apparatus, and non-transitory computer-readable medium described above, the data transmission may be transmitted using a physical data channel. In some examples of the method, apparatus, and non-transitory computer-readable medium described above, the DMRS transmission may be transmitted using resources reserved for DMRS transmissions.

In some examples of the method, apparatus, and non-transitory computer-readable medium described above, the DMRS transmission may convey phase reference information associated with the physical data channel.

A further method of wireless communication is described. The method may include detecting a set of reference signal bits associated with a DMRS transmission, decoding a set of data bits associated with a data transmission, receiving a set of CRC bits with the set of data bits, and performing a CRC verification process based at least in part on the set of CRC bits, wherein the set of CRC bits is computed based at least in part on both the set of reference signal bits and the set of data bits.

An apparatus for wireless communication is described. The apparatus may include means for detecting a set of reference signal bits associated with a DMRS transmission, means for decoding a set of data bits associated with a data transmission, means for receiving a set of CRC bits with the set of data bits, and means for performing a CRC verification process based at least in part on the set of CRC bits, wherein the set of CRC bits is computed based at least in part on both the set of reference signal bits and the set of data bits.

Another apparatus for wireless communication is described. The apparatus may include a processor, memory in electronic communication with the processor, and instructions stored in the memory. The instructions may be operable to cause the processor to detect a set of reference signal bits associated with a DMRS transmission, decode a set of data bits associated with a data transmission, receive a set of CRC bits with the set of data bits, and perform a CRC verification process based at least in part on the set of CRC bits, wherein the set of CRC bits is computed based at least in part on both the set of reference signal bits and the set of data bits.

A non-transitory computer readable medium for wireless communication is described. The non-transitory computer-readable medium may include instructions operable to cause a processor to detect a set of reference signal bits associated with a DMRS transmission, decode a set of data bits associated with a data transmission, receive a set of CRC bits with the set of data bits, and perform a CRC verification process based at least in part on the set of CRC bits, wherein the set of CRC bits is computed based at least in part on both the set of reference signal bits and the set of data bits.

Some examples of the method, apparatus, and non-transitory computer-readable medium described above may further include processes, features, means, or instructions for determining whether the CRC verification process is successful.

A further method of wireless communication is described. The method may include identifying a set of reference signal bits associated with a DMRS transmission and a set of data bits associated with a data transmission. The method may further include identifying a scrambling code based at least in part on the set of reference signal bits, scrambling the set of data bits based at least in part on the identified scrambling code, and transmitting the DMRS transmission and the data transmission.

An apparatus for wireless communication is described. The apparatus may include means for identifying a set of reference signal bits associated with a DMRS transmission and a set of data bits associated with a data transmission. The apparatus may further include means for identifying a scrambling code based at least in part on the set of reference signal bits, means for scrambling the set of data bits based at least in part on the identified scrambling code, and means for transmitting the DMRS transmission and the data transmission.

Another apparatus for wireless communication is described. The apparatus may include a processor, memory in electronic communication with the processor, and instructions stored in the memory. The instructions may be operable to cause the processor to identify a set of reference signal bits associated with a DMRS transmission and a set of data bits associated with a data transmission. The instructions may be further operable to cause the processor to identify a scrambling code based at least in part on the set of reference signal bits, scramble the set of data bits based at least in part on the identified scrambling code, and transmit the DMRS transmission and the data transmission.

A non-transitory computer readable medium for wireless communication is described. The non-transitory computer-readable medium may include instructions operable to cause a processor to identify a set of reference signal bits associated with a DMRS transmission and a set of data bits associated with a data transmission. The instructions may be further operable to cause a processor to identify a scrambling code based at least in part on the set of reference signal bits, scramble the set of data bits based at least in part on the identified scrambling code, and transmit the DMRS transmission and the data transmission.

Some examples of the method, apparatus, and non-transitory computer-readable medium described above may further include processes, features, means, or instructions for calculating a set of CRC bits based at least in part on both the set of reference signal bits and the set of data bits.

In some examples of the method, apparatus, and non-transitory computer-readable medium described above, the data transmission may be transmitted using a physical data channel. In some examples of the method, apparatus, and non-transitory computer-readable medium described above, the DMRS transmission may be transmitted using resources reserved for DMRS transmissions.

In some examples of the method, apparatus, and non-transitory computer-readable medium described above, the DMRS transmission may convey phase reference information associated with the physical data channel.

A further method of wireless communication is described. The method may include detecting a set of reference signal bits associated with a DMRS transmission and a set of data bits associated with a data transmission, identifying a scrambling code based on the set of reference signal bits, and scrambling the set of data bits based on the identified scrambling code.

An apparatus for wireless communication is described. The apparatus may include a processor, memory in electronic communication with the processor, and instructions stored in the memory. The instructions may be executable by the processor to cause the apparatus to detect a set of reference signal bits associated with a DMRS transmission and a set of data bits associated with a data transmission, identify a scrambling code based on the set of reference signal bits, and descramble the set of data bits based on the identified scrambling code.

Another apparatus for wireless communication is described. The apparatus may include means for detecting a set of reference signal bits associated with a DMRS transmission and a set of data bits associated with a data transmission, identifying a scrambling code based on the set of reference signal bits, and scrambling the set of data bits based on the identified scrambling code.

A non-transitory computer-readable medium storing code for wireless communication is described. The code may include instructions executable by a processor to detect a set of reference signal bits associated with a DMRS transmission and a set of data bits associated with a data transmission, identify a scrambling code based on the set of reference signal bits, and descramble the set of data bits based on the identified scrambling code.

In some examples of the method, apparatuses, and non-transitory computer-readable medium described herein, the data transmission may be transmitted using a physical data channel.

Some examples of the method, apparatuses, and non-transitory computer-readable medium described herein may further include operations, features, means, or instructions for performing a CRC verification process based on a set of CRC bits, where the set of CRC bits may be computed based on both the set of reference signal bits and the set of data bits.

In some examples of the method, apparatuses, and non-transitory computer-readable medium described herein, the data transmission may be transmitted using a physical data channel and the DMRS transmission may be transmitted using resources reserved for DMRS transmissions.

In some examples of the method, apparatuses, and non-transitory computer-readable medium described herein, the DMRS transmission conveys phase reference information associated with the physical data channel.

DETAILED DESCRIPTION

Figure 1:
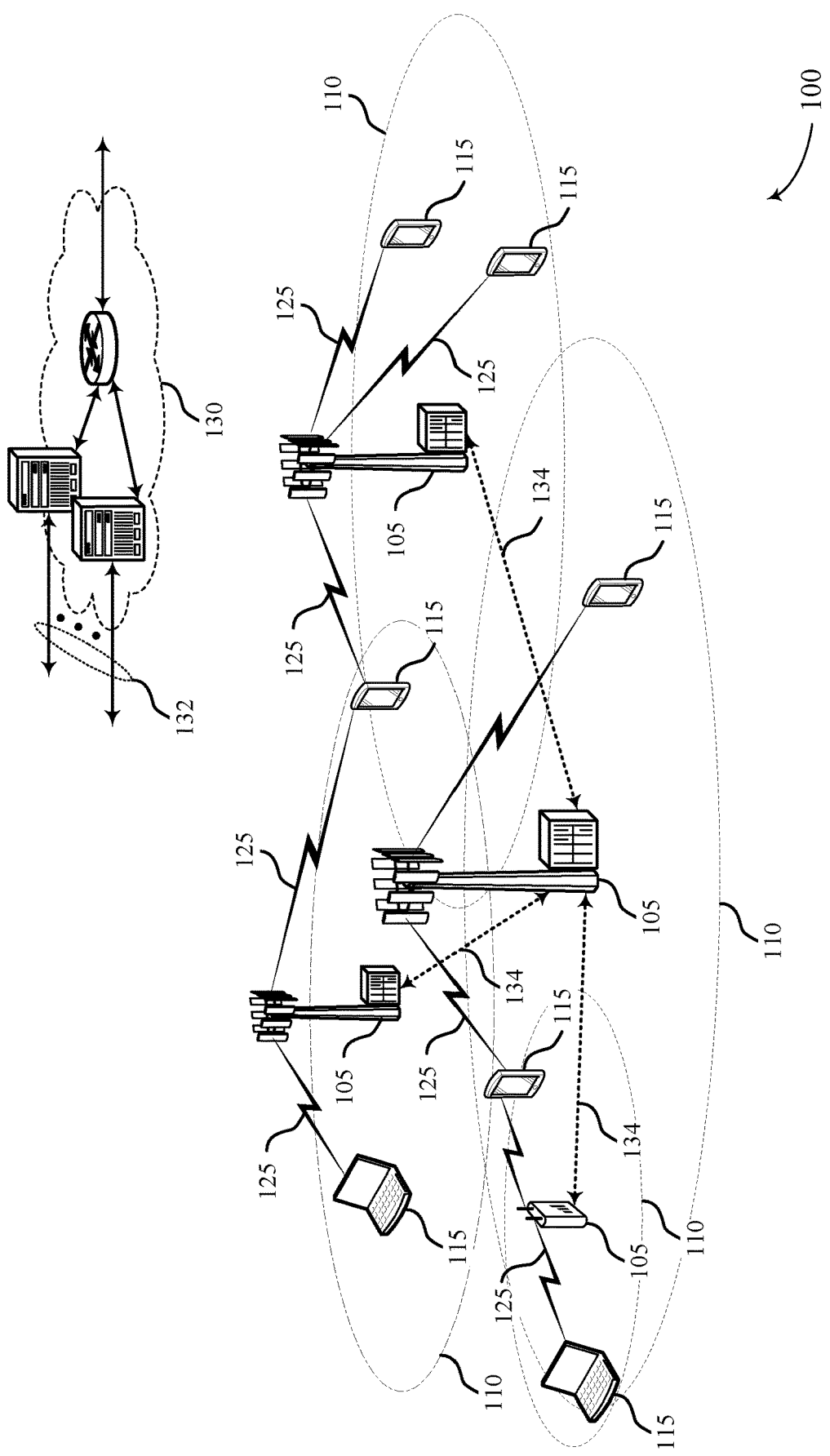
FIGS. 1 and 2 illustrate examples of systems for wireless communication that support providing protection for information delivered in DMRS in accordance with aspects of the present disclosure.

In some wireless communications systems (e.g., new radio (NR) wireless systems), a device—such as a base station or a user equipment (UE)—may transmit a DMRS associated with a physical data channel, and may transmit a data payload on the same physical data channel. To extend the functionality of DMRS signaling, the DMRS may include signaling information in addition to channel estimation information. For example, the signaling information may be conveyed in the DMRS using pseudo noise (PN) sequences. Although the cross-correlation between PN sequences may be low, a device receiving a DMRS may incorrectly detect a PN sequence, which may cause incorrect reception of the signaling information. To improve reception of the DMRS signaling information at a receiving wireless device, the transmitting device may employ data protection techniques to the signaling information and modify the data payload with information corresponding to the signaling information.

In one aspect, the transmitting device may employ CRC techniques to include verification for the signaling information. For example, the device may compute the CRC bits based on the signaling information in the DMRS in addition to the information in the payload. In another example, the device may compute a preliminary set of CRC bits based on information in the payload. The device may then mask the preliminary set of CRC bits using a bit array generated based on the DMRS signaling information. In both examples, the resulting set of CRC bits may include indications of the correct DMRS signaling information. The device may select or be configured with a CRC configuration (e.g., computing the CRC based on the DMRS signaling information or masking the CRC based on the DMRS signaling information) statically or dynamically. In some cases, the selection may be based on a number of DMRS signaling information bits, data payload information bits, CRC bits, or some combination of these numbers of bits. The device may transmit the CRC bits in the data payload to a receiving device, and the receiving device may use the CRC bits to verify the decoding of information received in both the data payload and the DMRS.

In another aspect, the transmitting device may determine a scrambling code based on the DMRS signaling information. The device may scramble the data payload bits based on the determined scrambling code. Accordingly, a receiving device may detect the DMRS signaling information, and may begin decoding the data payload based on the detected DMRS signaling information. If the receiving device incorrectly detected the DMRS signaling information, decoding of the data payload may fail early in the process due to the scrambled payload bits.

Aspects of the disclosure are initially described in the context of wireless communications systems. Further aspects of the disclosure are described with reference to a resource element (RE) mapping format, CRC processes with DMRS signaling information, a CRC masking function, and process flow diagrams. Aspects of the disclosure are further illustrated by and described with reference to apparatus diagrams, system diagrams, and flowcharts that relate to providing protection for information delivered in DMRS.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a 5th Generation (5G)/New Radio (NR) or long term evolution (LTE) (or LTE-Advanced (LTE-A)) network. In one aspect, wireless communications system 100 may support enhanced broadband communications, ultra-reliable (i.e., mission critical) communications, low latency communications, and communications with low-cost and low-complexity devices. The wireless communications system 100 may support conveying signaling information in DMRS transmissions in addition to channel estimation information. A device may protect the signaling information within the DMRS (e.g., using CRC or scrambling techniques) and may modify data transmissions to include the protection, which may improve detection reliability and decrease latency associated with conveying signaling information in DMRS.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some examples, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some examples, groups of UEs 115 communicating via D2D communications may utilize a one-to-many (1:M) system in which each UE 115 transmits to every other UE 115 in the group. In one aspect, a base station 105 facilitates the scheduling of resources for D2D communications. In another aspect, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In one aspect, an MTC device may operate using half-duplex (one-way) communications at a reduced peak rate. MTC devices may also be configured to enter a power saving "deep sleep" mode when not engaging in active communications. In some examples, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra-high frequency (UHF) frequency region using frequency bands from 700 MHz to 2600 MHz (2.6 GHz), although some networks (e.g., a wireless local area network (WLAN)) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some examples, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some examples, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In one aspect, the antennas of a base station 105 or UE 115 may be located within one or more antenna arrays, which may support beamforming or MIMO operation. One or more base station antennas or antenna arrays may be collocated at an antenna assembly, such as an antenna tower. In some examples, antennas or antenna arrays associated with a base station 105 may be located in diverse geographic locations. A base station 105 may multiple use antennas or antenna arrays to conduct beamforming operations for directional communications with a UE 115.

In some examples, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use Hybrid ARQ (HARD) to provide retransmission at the MAC layer to improve link efficiency. In the control plane, the Radio Resource Control (RRC) protocol layer may provide establishment, configuration, and maintenance of an RRC connection between a UE 115 and a network device 105-c, network device 105-b, or core network 130 supporting radio bearers for user plane data. At the Physical (PHY) layer, transport channels may be mapped to physical channels.

A resource element may consist of one symbol period and one subcarrier (e.g., a 15 KHz frequency range). A resource block may contain 12 consecutive subcarriers in the frequency domain and, for a normal cyclic prefix in each OFDM symbol, 7 consecutive OFDM symbols in the time domain (1 slot), or 84 resource elements. The number of bits carried by each resource element may depend on the modulation scheme (the configuration of symbols that may be selected during each symbol period). Thus, the more resource blocks that a UE receives and the higher the modulation scheme, the higher the data rate may be.

Wireless communications system 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both frequency division duplexed (FDD) and time division duplexed (TDD) component carriers.

In one aspect, wireless system 100 may utilize both licensed and unlicensed radio frequency spectrum bands. For example, wireless system 100 may employ LTE License Assisted Access (LTE-LAA) or LTE Unlicensed (LTE U) radio access technology or NR technology in an unlicensed band such as the 5 GHz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. Operations in unlicensed bands may be based on a CA configuration in conjunction with CCs operating in a licensed band. Operations in unlicensed spectrum may include downlink transmissions, uplink transmissions, or both. Duplexing in unlicensed spectrum may be based on FDD, TDD, or a combination of both.

In some systems, a base station 105 or a UE 115 may transmit a DMRS to a receiving device for the receiving device to perform channel estimation on a physical data channel. In one aspect, along with the channel estimation information, the DMRS may include additional signaling information (e.g., timing information or uplink control information). To enhance the reliability of conveying such signaling information in DMRS transmissions, the transmitting device may include error detection check bits in a data payload transmitted over the physical data channel associated with the DMRS. For example, the transmitting device may calculate CRC bits for the data payload based on the signaling information contained in the DMRS. In some aspects, the transmitting device may determine a scrambling code based on the signaling information in the DMRS, and may scramble the bits of the data payload based on the scrambling code. A receiving device may use the error detection check or the scrambling code contained in the data payload to verify the detected DMRS signaling information.

Figure 2:
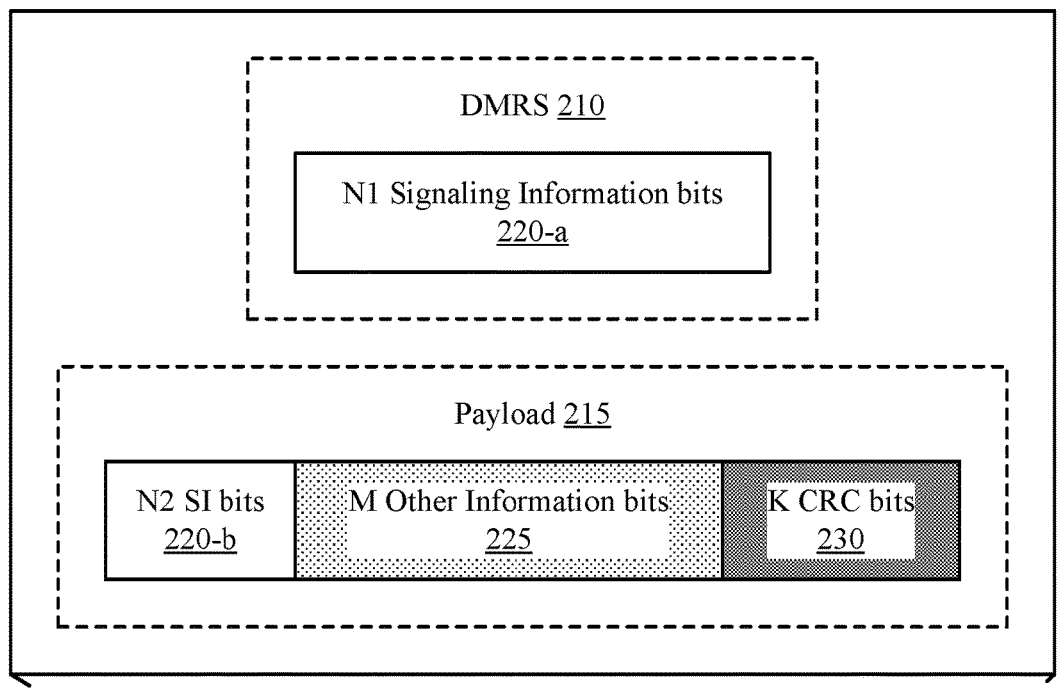

FIG. 2 illustrates an example of a wireless communications system 200 that supports providing protection for information delivered in DMRS in accordance with various aspects of the present disclosure. The wireless communications system 200 may include base station 105-a, geographic coverage area 110-a, and UE 115-a, which may be examples of the corresponding devices and features described with reference to FIG. 1. Base station 105-a and UE 115-a may communicate on the uplink, downlink, or both over communication link 205. Both base station 105-a and UE 115-a may transmit a DMRS 210 over communication link 205 along with a data payload 215. To provide protection and more reliable detection for the DMRS 210, the transmitting device may modify the payload 215. For example, the transmitting device may include an indication within the CRC bits 230 of information (e.g., signaling information) transmitted in the DMRS 210, or the transmitting device may determine a scrambling code based on the information in the DMRS 210, and may scramble bits within the payload 215 based on the scrambling code.

A wireless transmitter (e.g., base station 105-a or UE 115-a) may transmit a reference signal—such as a DMRS 210—to a receiving device in order for the receiving device to perform channel estimation. For example, in the uplink, UE 115-a may transmit a DMRS 210 to base station 105-a, and base station 105-a may estimate a channel quality or a phase shift associated with the wireless channel based on the received DMRS 210. In the downlink, base station 105-a may transmit a DMRS 210 to UE 115-a for channel estimation (e.g., in addition to or instead of transmitting a cell-specific reference signal). A DMRS 210 may be associated with a physical data channel, such as a physical broadcast channel (PBCH), a physical uplink shared channel (PUSCH), a physical uplink control channel (PUCCH), a physical downlink shared channel (PDSCH), or any other channel that carries data payloads 215. A device may transmit the DMRS 210 over the associated physical data channel, or in resources allocated for DMRS transmission.

In some wireless systems—such as next generation or NR wireless systems—a device may extend the functionality of DMRS 210 beyond channel estimation. For example, base station 105-a and/or UE 115-a may include signaling information 220-a in the DMRS 210. This signaling information 220-a may include a timing indication, a payload identifier, or other signaling information. For example, the timing indication may include a system frame number (SFN), a synchronization signal block time index, or any other timing information associated with a physical data channel. The payload identifier may identify one or more multiplexed payloads 215 in a physical data channel (e.g., for a PUSCH, uplink control information (UCI) multiplexed payloads). The device may construct DMRSs 210 using different DMRS sequences, where the different DMRS sequences may correspond to the signaling information to transmit within the DMRS 210. The DMRS sequences may be constructed based on pseudorandom-noise (PN) sequences, which may reduce cross-correlation of bits between different DMRS sequences. In one example, if the device transmits 4 bits of signaling information 220-a in a DMRS 210, the device may utilize one of sixteen DMRS sequences to indicate the information. A device receiving the DMRS 210 may perform correlation and/or detection to determine the signaled DMRS sequence. For example, at a receiver of the device, the device may correlate the received signal with a DMRS sequence hypothesis, and may select a received DMRS sequence based on the hypothesis and the received DMRS signal. The PN sequences used to construct the DMRS sequences may limit the false alarm rate—that is, the receiver may select an incorrect DMRS sequence, and in turn decode incorrect information bits based on the incorrect detection of the DMRS sequence).

In some examples, a device (e.g., base station 105-a and/or UE 115-a) may transmit some signaling information 220-a in a DMRS 210, and may transmit other signaling information 220-b within a data payload 215 over a physical data channel. The device may determine the number of bits of signaling information 220-a to transmit in the DMRS 210 and the number of bits of signaling information 220-b to transmit in the data payload 215 based on a significance of the bits, a number of bits available for signaling information in the DMRS 210, or other signaling information splitting criteria. The complete set of signaling information bits 220 may be referred to as N bits. In the examples where the signaling information bits are divided between the DMRS 210 and the data payload 215, the signaling information bits 220-a transmitted in the DMRS 210 may be referred to as N1 bits, and the signaling information bits 220-b transmitted in the payload 215 may be referred to as N2 bits. The signaling information bits 220 may include bits indicating an SFN or a synchronization signal block. For example, for the SFN, the device may transmit a total of 10 signaling information bits 220, including 2 bits (e.g., N1 bits) in the DMRS 210 and 8 bits (e.g., N2 bits) in the data payload 215. In another example, the device may transmit all of the SFN signaling information bits 220 in the DMRS 210, in which case the data payload 215 may not include any N2 bits.

A device may receive a DMRS 210, and in some examples the device may detect an incorrect DMRS sequence associated with the DMRS 210 (e.g., based on channel noise, an incorrect DMRS hypothesis, etc.). This incorrect DMRS detection may result in processing latency or delays at the device. For example, the device may begin decoding a data payload 215 received over a physical data channel (e.g., the PBCH) using the incorrect DMRS sequence, which may result in decoding failure. The device may determine the decoding failure based on channel coding or CRC bits 230 associated with the data payload 215. In one aspect, the device may identify that the decoding failure is based on an incorrect DMRS sequence, and the device may remove the DMRS sequence from physical data channel decoding.

However, in another aspect, the device may not determine whether the decoding failure is based on the selected DMRS sequence or the received signals corresponding to the data payload 215. In such an aspect, the device may not remove the DMRS sequence from data channel decoding. In some procedures, the device may decode a data payload 215 despite using an incorrect DMRS sequence. However, further processing of the payload 215 (e.g., remaining minimum system information (RMSI) acquisition) may eventually fail based on the incorrect DMRS sequence used for decoding. In one aspect (e.g., when receiving PUSCH DMRS 210), incorrect DMRS sequence detection may result in a delayed HARQ transmission. In any of the above aspects, the device may perform unnecessary or unsuccessful decoding operations on a data payload 215 based on an incorrect DMRS sequence, and may use additional time to correctly perform the decoding operations or further procedures. Accordingly, improving the reliability of DMRS sequence detection may improve processing latency—such as system acquisition latency, handover latency, or HARQ retransmission delay, among other processes—at the device.

The device may include protection within a data payload 215 to improve the reliability of correctly decoding the data payload 215. For example, the data payload 215 may include error correcting code bits, such as CRC bits 230. The device may determine K CRC bits 230 by performing a CRC computation on the bits in the data payload 215 containing information. For example, the data payload 215 may include N2 signaling information bits 220-b, as well as M other information bits 225. The K CRC bits 230 may be based on both of these sets of information bits (e.g., the N2 bits and the M bits). However, a DMRS 210 may not contain similar CRC bits to improve reliability of determining the N1 signaling information bits 220-a. Instead, the device may modify the CRC bits 230 within the data payload 215 to additionally include information about the corresponding DMRS 210. For example, the device may alter the CRC computation or the resulting CRC bit sequence for the payload 215 further based on the N1 signaling information bits 220-a transmitted in the associated DMRS 210. In this way, a receiver may use the CRC bits 230 in the data payload 215 to further improve detection of the corresponding DMRS sequence.

The device may implement a static or dynamic CRC configuration design. In a static CRC configuration design, the device may implement a same CRC determination process for all scenarios. In one implementation, the device may perform a CRC computation on the N1 signaling information bits 220-a, the N2 signaling information bits 220-b, and the M other information bits 225. In a second implementation, the device may perform the CRC computation on the N2 signaling information bits 220-b and the M other information bits 225 to obtain a set of preliminary CRC bits, and may perform a masking function on the preliminary CRC bits based on the N1 signaling information bits 220-a. In the static design, the device may implement one such implementation. However, in a dynamic CRC configuration design, the device may semi-statically switch between implementations for determining the CRC bits 230. For example, the device may switch between implementations based on the number of N1 bits, N2 bits, M bits, K bits, or some combination of these bits to transmit. In a specific example, the device may determine threshold numbers of N1 signaling information bits 220-a in relation to K CRC bits 230, and may switch based on these threshold numbers. Below a certain threshold of N1 bits, the device may implement the CRC computation design, and above the threshold the device may implement the CRC masking design. For example, if the number of N1 bits is greater than half the number of K bits, but less than the total number of K bits, the device may select the masking implementation. Otherwise, the device may select the computation implementation.

The device may perform scrambling to improve protection for the DMRS signaling information bits 220-a. For example, the device may determine a scrambling code based on the N1 signaling information bits 220-a in the DMRS 210. The device may scramble some or all of the bits in the data payload 215 based on this scrambling code. For example, the device may scramble the N2 signaling information bits 220-b, the M other information bits 225, the K CRC bits 230, any other bits in the data payload 215 (e.g., other redundancy bits), or some combination of these sets of bits. A device may receive the DMRS 210 and the scrambled data payload 215. If the receiving device incorrectly determines the DMRS sequence, decoding of the data payload 215 may fail based on the scrambling sequence. In this way, scrambling the data payload 215 may improve the processing latency, as the decoding of the data payload 215 may automatically fail early in decoding based on the incorrect DMRS sequence.

Figure 3:
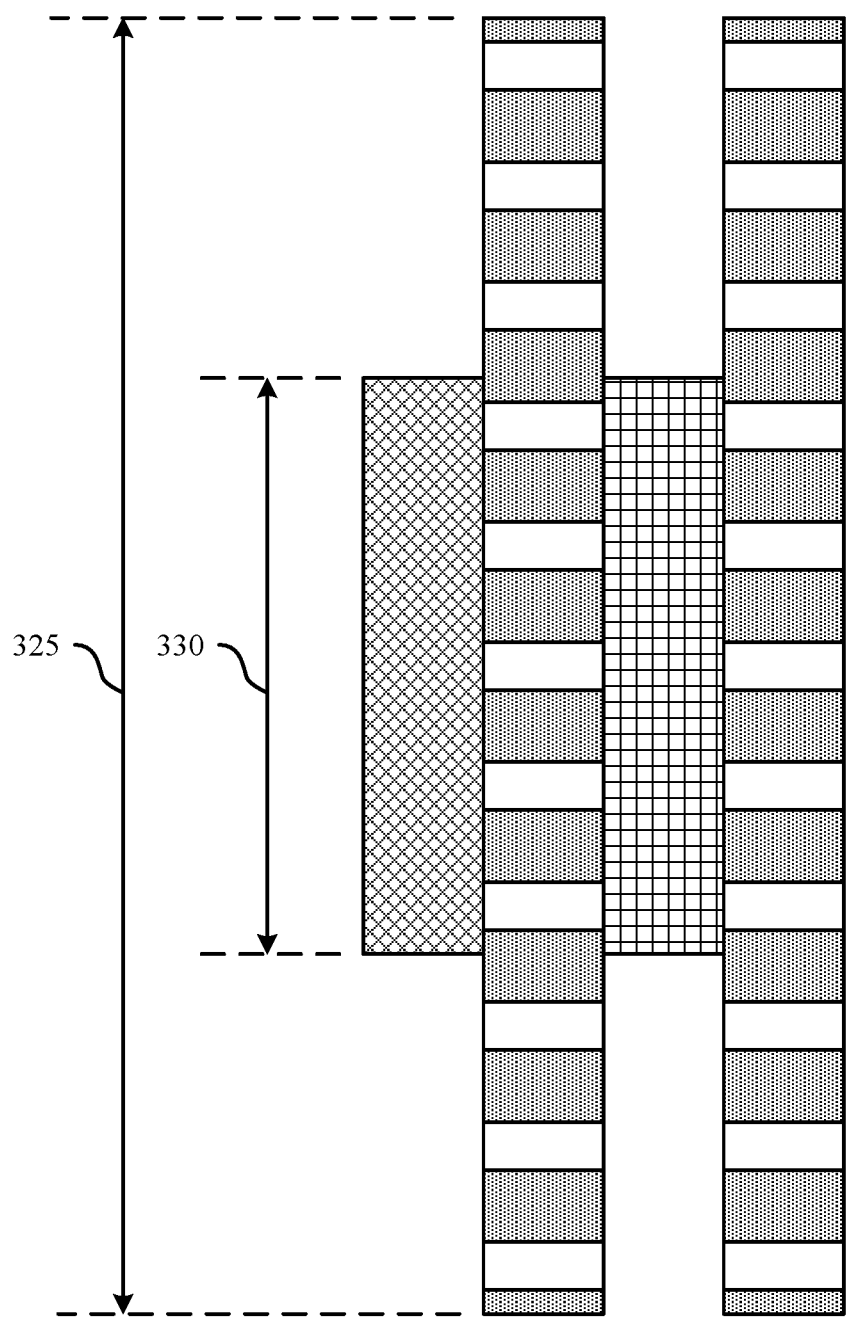
FIG. 3 illustrates an example of resource element (RE) mapping that supports providing protection for information delivered in DMRS in accordance with aspects of the present disclosure.

FIG. 3 illustrates an example of resource element (RE) mapping 300 that supports providing protection for information delivered in DMRS in accordance with various aspects of the present disclosure. The RE mapping 300 may include REs allocated for DMRS transmission 305, PBCH transmission 310, primary synchronization signal (PSS) transmission 315, secondary synchronization signal (SSS) transmission 320, or some combination of these transmissions. Many other RE mapping formats may be used for the transmission of DMRS 305.

A UE 115 may transmit DMRS 305 on the uplink or a base station 105 may transmit DMRS 305 on the downlink. In addition to the DMRS 305, the UE 115 or base station 105 may additionally transmit a primary synchronization signal (PSS) 315, a secondary synchronization signal (SSS) 320, or both. The PSS 315, SSS 320, or both may be transmitted over a different bandwidth than the bandwidth allocated for the PBCH 310. For example, the PBCH 310 may span a first bandwidth 325 while the PSS 315 and SSS 320 may span a second bandwidth 330, which may be a smaller bandwidth. In one specific example, the first bandwidth 325 may span 288 resource elements (REs), while the second bandwidth 330 may span 127 REs. In one aspect, the UE or base station may leave a buffer on either end of the second bandwidth 330 where no signal is transmitted.

The UE 115 or base station 105 may interleave the DMRS 305 throughout the PBCH 310 bandwidth 325. In this way, DMRS 305 and PBCH 310 may be transmitted at a same time or during a same TTI (e.g., a same symbol or slot or subframe). The UE 115 or base station 105 may include an indication of the DMRS 305 within a CRC transmitted in the PBCH 310 (e.g., using a computation process or a masking process). The PBCH 310 may include protection for the DMRS 305 transmitted in the same TTI as the PBCH 310. This protection may include CRC protection or scrambling protection within a data payload transmitted in the PBCH 310.

Figure 4:
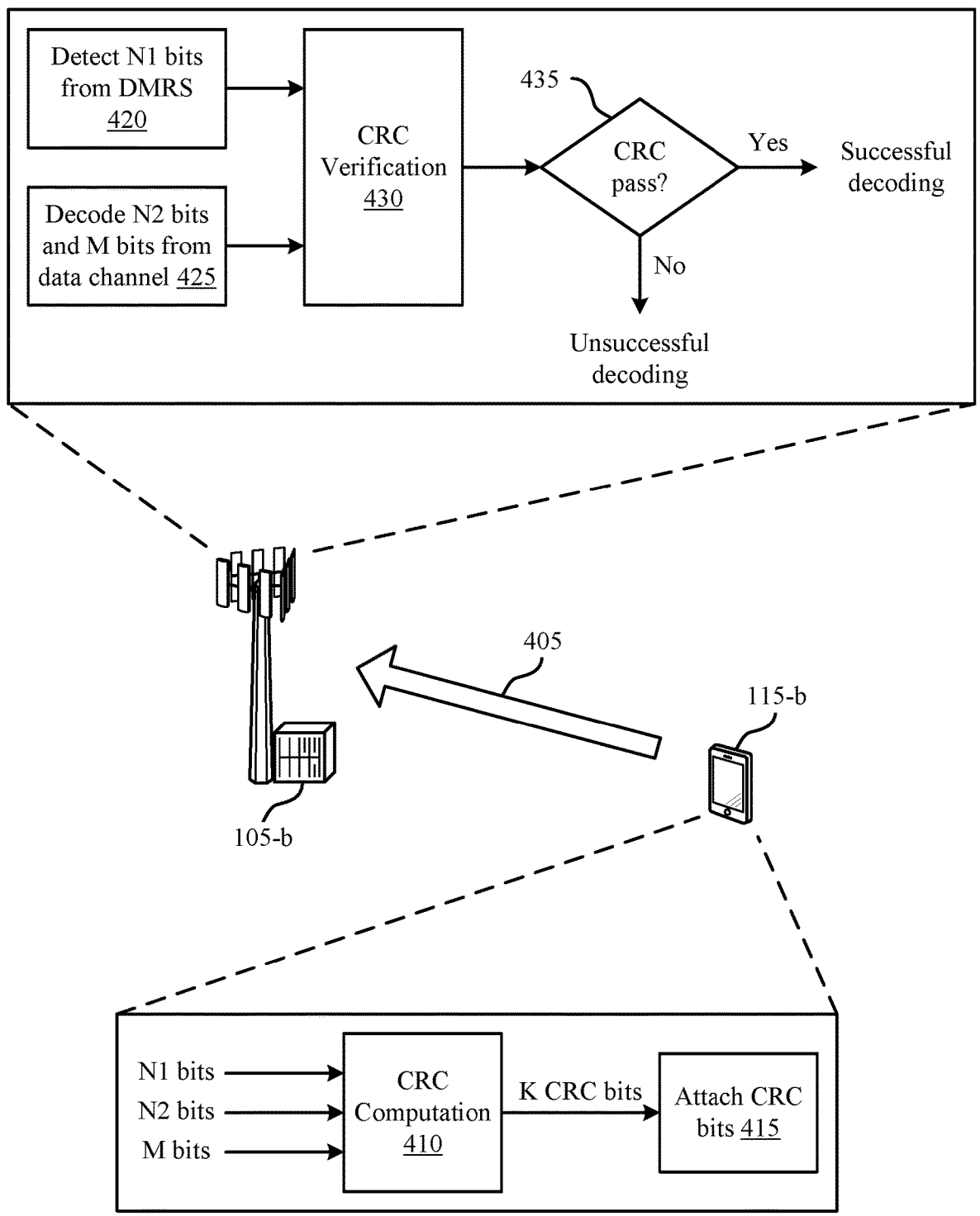
FIG. 4 illustrates an example of a CRC computation process with DMRS signaling information that supports providing protection for information delivered in DMRS in accordance with aspects of the present disclosure.

FIG. 4 illustrates an example of a CRC computation process with DMRS signaling information 400 that supports providing protection for information delivered in DMRS in accordance with various aspects of the present disclosure. The CRC computation process with DMRS signaling information 400 may illustrate one possible design for improving reliability of DMRS signaling information. The process may show a UE, such as UE 115-*b*, generating the DMRS and data payload, and transmitting the DMRS and data payload on an uplink communication link 405 to base station 105-*b*. However, the CRC computation process with DMRS signaling information 400 may apply in the downlink as well. For example, base station 105-*b* may perform the transmitter side processes, while UE 115-*b* may perform the receiver side processes.

As illustrated, UE 115-*b* may perform a set of transmitter side processes to protect DMRS signaling information. The DMRS signaling information may be included in N1 bits within a DMRS. Further signaling information may be included in N2 bits included in a data payload. However, in some examples, the data payload may not include any further signaling information bits (e.g., there may be 0 N2 bits). Additionally, the data payload may include M other information bits. UE 115-*b* may perform a CRC computation at 410 on the N1 bits, the N2 bits, and the M bits. The CRC computation may be an example of a systematic cyclic code, a polynomial division algorithm, a shift register based division algorithm, or any similar functions for determining a set of CRC bits based on a set of input bits (e.g., in this aspect, the N1 bits, the N2 bits, and the M bits). The CRC computation at 410 may result in K CRC bits, which UE 115-*b* may attach or append to the data payload at 415. With the CRC bits included in the data payload, UE 115-*b* may transmit the DMRS and the payload to base station 105-*b* (e.g., using a format such as the one described with reference to FIG. 3) on the uplink communication link 405, which may be an example of a physical data channel.

Base station 105-*b* may receive the DMRS and the data payload, and may perform a set of receiver side functions in order to determine the information carried in the DMRS and the data payload. Base station 105-*b* may detect N1 signaling information bits based on the DMRS at 420. Additionally, base station 105-*b* may decode N2 additional signaling information bits, as well as M other information bits, based on the data payload received over the physical data channel at 425. At 430, base station 105-*b* may perform CRC verification on the detected and decoded bits. For example, base station 105-*b* may perform a CRC function on the N1, N2, and M bits in order to determine an expected value for the set of CRC bits attached to the data payload. At 435, base station 105-*b* may compare the expected set of CRC bits to the actual received set of CRC bits. If the expected and received sets of CRC bits match, the CRC may pass and base station 105-*b* may determine that the signaling information in the DMRS and the signaling and other information in the data payload were detected and decoded correctly. If the expected set of CRC bits is different than the received set of CRC bits, the CRC may fail, and base station 105-*b* may determine that the signaling information in the DMRS, the signaling and other information in the data payload, or a combination of the two was incorrectly detected or decoded. In this way, the CRC bits included in the data payload may check not only the accuracy of the information contained in the data payload, but also the accuracy of information detected in the DMRS transmission.

Figure 5:
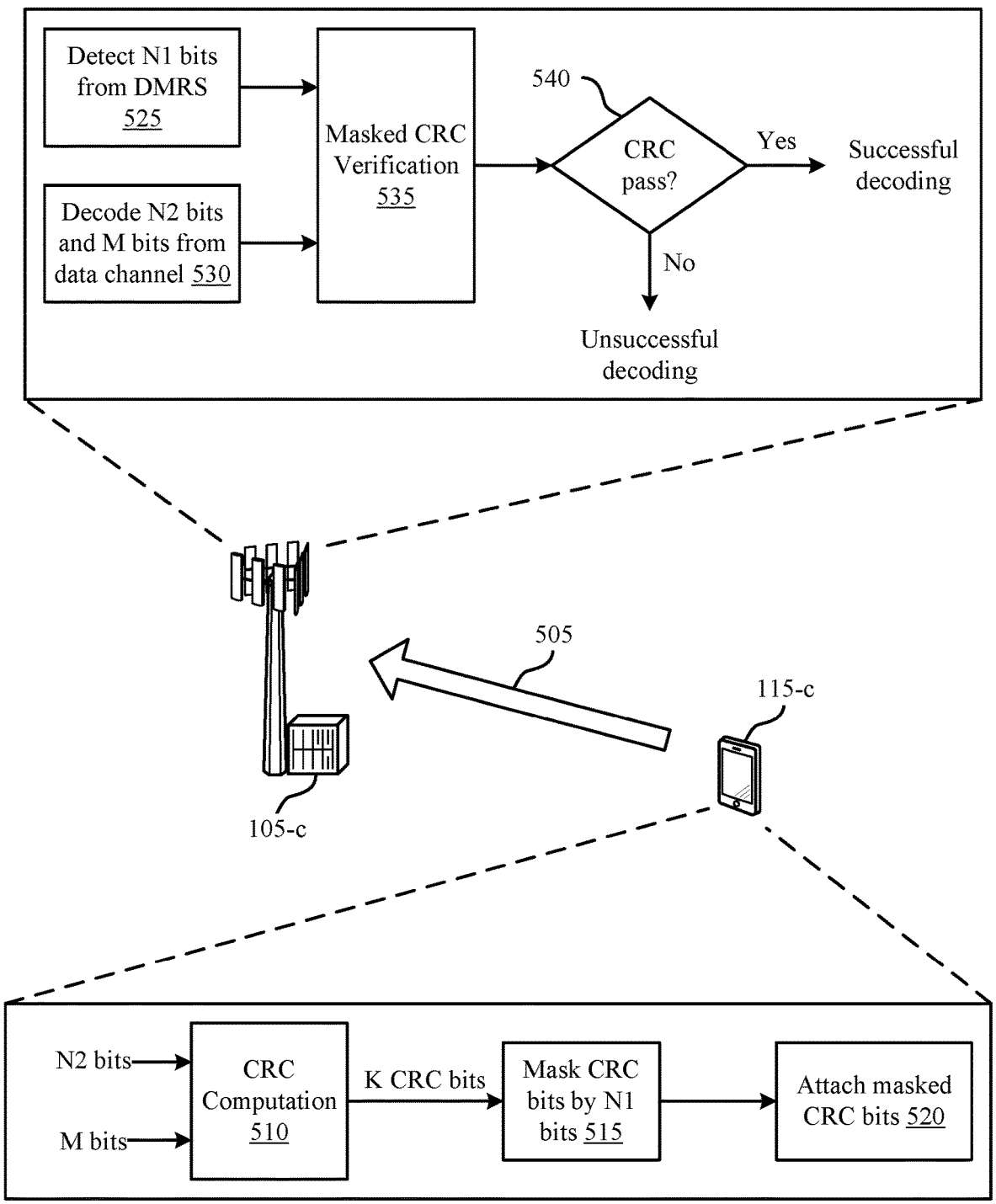
FIG. 5 illustrates an example of a CRC masking process with DMRS signaling information that supports providing protection for information delivered in DMRS in accordance with aspects of the present disclosure.

FIG. 5 illustrates an example of a CRC masking process with DMRS signaling information 500 that supports providing protection for information delivered in DMRS in accordance with various aspects of the present disclosure. The CRC masking process with DMRS signaling information 500 may illustrate one possible design for improving reliability of DMRS signaling information. The process may show a UE, such as UE 115-*c*, generating the DMRS and data payload, and transmitting the DMRS and data payload on an uplink communication link 505 to base station 105-*c*. However, the CRC masking process with DMRS signaling information 500 may apply in the downlink as well. For example, base station 105-*c* may perform the transmitter side processes, while UE 115-*c* may perform the receiver side processes.

UE 115-*c* may perform a set of transmitter side processes to protect DMRS signaling information. The DMRS signaling information may be included in N1 bits within a DMRS. Further signaling information may be included in N2 bits included in a data payload. However, in some examples, the data payload may not include any further signaling information bits. Additionally, the data payload may include M other information bits. UE 115-*c* may perform a CRC computation at 510 on the N2 bits and the M bits. The CRC computation at 510 may result in K CRC bits, which may be referred to as preliminary CRC bits. Rather than attaching the resulting CRC bits to the data payload, UE 115-*c* may perform a masking process on the preliminary CRC bits at 515. The masking process may be based on the N1 signaling information bits transmitted in the DMRS. In this way, the resulting masked CRC bits are based on both the N1 signaling information bits from the DMRS and the N2 and M information bits from the data payload. UE 115-*c* may attach the masked CRC bits to the data payload at 520. With the masked CRC bits included in the data payload, UE 115-*c* may transmit the DMRS and the payload to base station 105-*c* on the uplink communication link 505, which may be an example of a physical data channel.

Base station 105-*c* may receive the DMRS and the data payload, and may perform a set of receiver side functions in order to determine the information carried in the DMRS and the data payload. Base station 105-*c* may detect N1 signaling information bits based on the DMRS at 525. Additionally, base station 105-*c* may decode N2 additional signaling information bits, as well as M other information bits, based on the data payload received over the physical data channel at 530. At 535, base station 105-*b* may perform CRC verification on the detected and decoded bits. For example, base station 105-c may first perform a function (e.g., an inverse masking function) on the received masked CRC bits based on the detected N1 signaling information bits in the DMRS. Base station 105-c may additionally perform a CRC function on the decoded N2 additional signaling information bits and M other information bits in the data payload to obtain an expected un-masked set of CRC bits. At 540, base station 105-c may compare the expected un-masked set of CRC bits to the output of the function (e.g., the inverse masking function). If the expected un-masked CRC bits match the output of the function, the CRC may pass and base station 105-c may determine that the signaling information in the DMRS and the signaling and other information in the data payload were detected and decoded correctly. If the expected un-masked CRC bits are different than the output of the function, the CRC may fail, and base station 105-c may determine that the signaling information in the DMRS, the signaling and other information in the data payload, or a combination of the two was incorrectly detected or decoded. In this way, the masked CRC bits included in the data payload may check not only the accuracy of the information contained in the data payload, but also the accuracy of information detected in the DMRS transmission.

Figure 6:
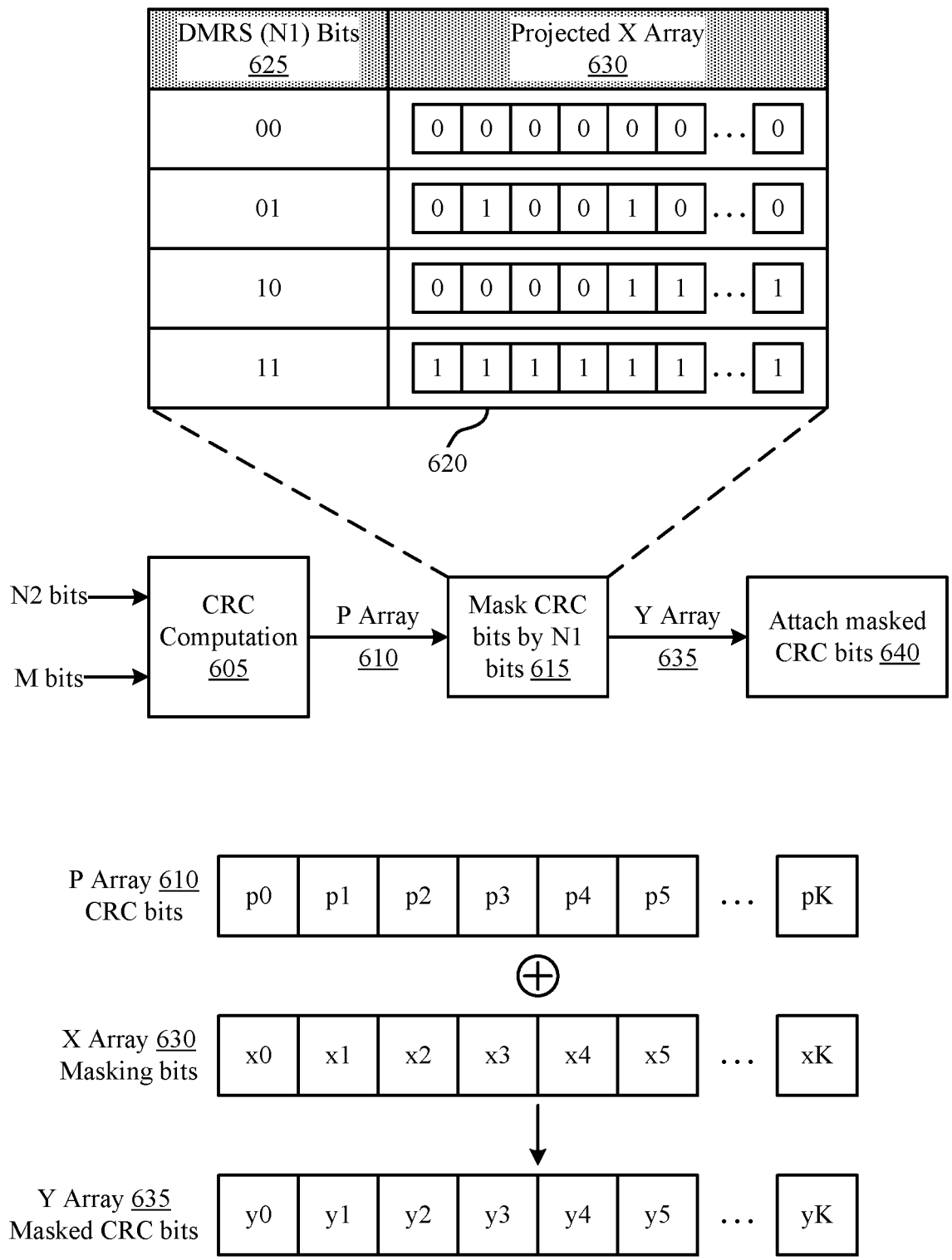
FIG. 6 illustrates an example of a CRC masking function that supports providing protection for information delivered in DMRS in accordance with aspects of the present disclosure.

FIG. 6 illustrates an example of a potential CRC masking function 600 that supports providing protection for information delivered in DMRS in accordance with various aspects of the present disclosure. The potential CRC masking function 600 may be performed at 515 by a transmitting device—such as a base station or a UE—as described with reference to FIG. 5. While FIG. 6 illustrates a potential CRC masking function 600, a transmitting device may implement other CRC masking functions in order to provide protection within a data payload for information in a DMRS.

A device may perform a CRC computation at 605, using N2 signaling information bits and M other information bits from a data payload as inputs. The CRC computation may output a preliminary set of CRC bits, which may be referred to as a P array 610. The P array 610 may contain K total bits, which may be the same number of bits as the device has allocated for CRC bits in the data payload.

At 615, the device may mask the preliminary set of CRC bits based on N1 signaling information bits 625 from a DMRS. In one aspect, the device may utilize a lookup table 620. The lookup table may include all possible values for the N1 signaling information bits 625, and corresponding X arrays 630. The X arrays 630 may be examples of distinct sets of bits also of length K. In another aspect, rather than using a lookup table 620, the device may implement a projecting function to project each value of N1 signaling information bits 625 onto an array of K bits. In this way, the device may convert the signaling information contained in the DMRS into a set of bits (e.g., an X array 630, which may be referred to as masking bits) equal in size to the preliminary set of CRC bits (e.g., the P array 610).

The device may perform an operation based on the P array 610 and the X array 630 to calculate a Y array 635 of masked CRC bits. For example, the device may perform an element-wise exclusive or (XOR) function on the P array 610 and the X array 630. For example, the device may perform an XOR function on the p0 and x0 indices of the P array 610 and the X array 630, respectively, and may assign the result of the function to the y0 index of the Y array 635. The device may apply this same process to the other indices of the P array 610 and the X array 630 to compute the remaining indices of the resulting Y array 635. At 640, the device may attach the computed masked CRC bits of the Y array 635 to the data payload for transmission.

A device receiving the data payload and a corresponding DMRS may detect N1 signaling information bits 625 within the DMRS, and may similarly decode the N2 and M bits of the data payload. The receiving device may then select an expected X array 630 based on the detected N1 signaling information bits 625 and an expected P array 610 based on the decoded N2 and M bits, and may perform an element-wise XOR function on the expected arrays to determine an expected Y array 635. The receiving device may compare the expected Y array 635 to the masked CRC bits received in the data payload to verify the detected and decoded information.

Figure 7:
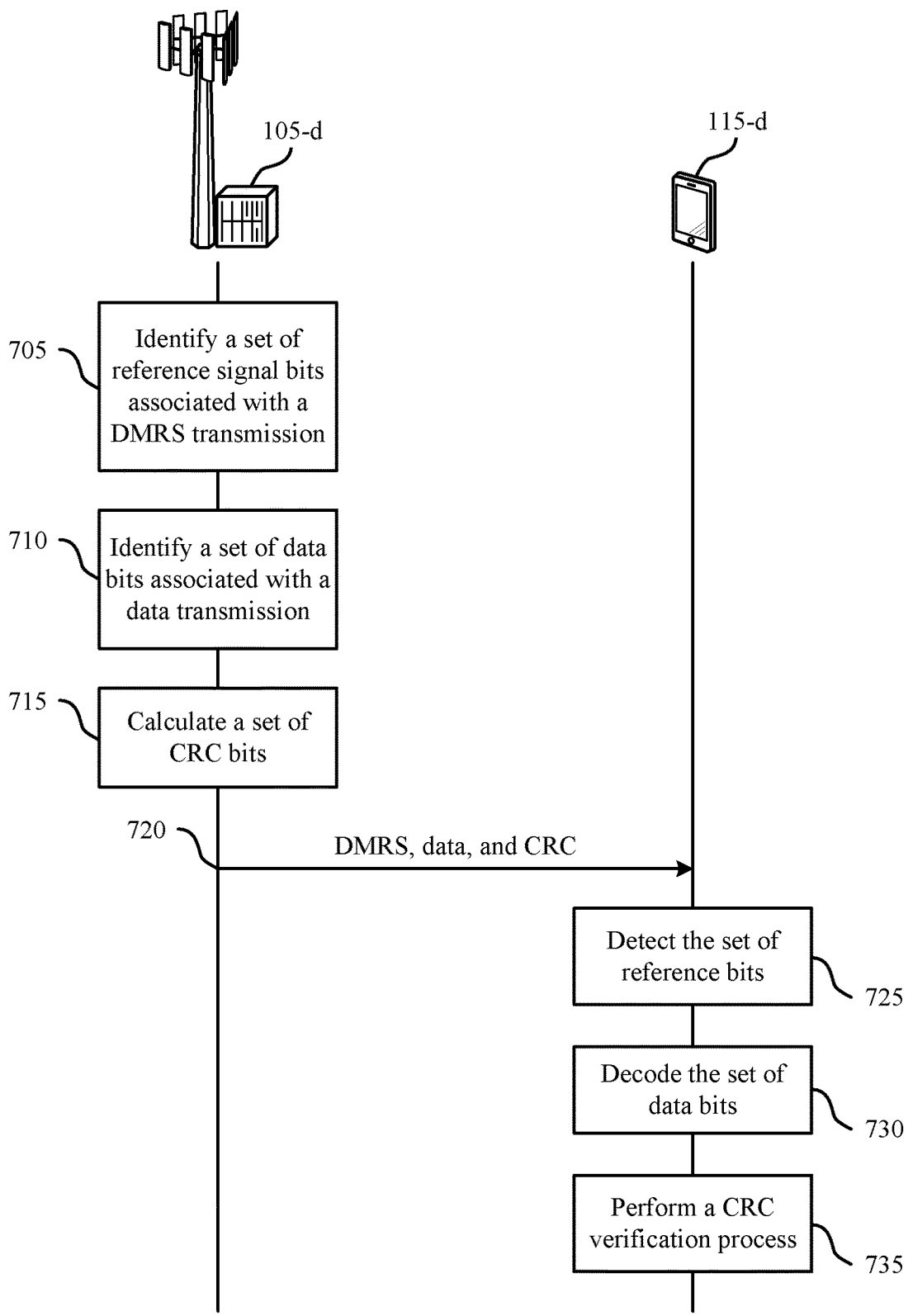
FIGS. 7 and 8 illustrate example of process flows that support providing protection for information delivered in DMRS in accordance with aspects of the present disclosure.

FIG. 7 illustrates an example of a process flow 700 that supports providing protection for information delivered in DMRS in accordance with various aspects of the present disclosure. The process flow 700 may include a base station 105-d and UE 115-d, which may be examples of the corresponding devices described with reference to FIGS. 1 and 2. The process flow 700 may illustrate a DMRS transmission on the downlink, but the same processes may apply to uplink DMRS transmissions as well.

At 705, the transmitting device (e.g., in this example, base station 105-d) may identify a set of reference signal bits associated with a DMRS transmission. In one aspect, the set of reference signal bits may include a first subset of reference signal bits to be conveyed with the DMRS transmission and a second subset of reference signal bits to be conveyed with the data transmission.

At 710, base station 105-d may identify a set of data bits associated with a data transmission. Base station 105-d may identify the set of data bits before or at the same time as the set of reference signal bits. Additionally, base station 105-d may identify a scrambling code based on the reference signal bits, and may scramble the data bits based on the scrambling code.

At 715, base station 105-d may calculate a set of CRC bits based on the set of reference signal bits and the set of data bits. In one aspect, base station 105-d may calculate the set of CRC bits based on the first subset of reference signal bits, the second subset of reference signal bits, and the set of data bits. In another aspect, base station 105-d may calculate a subset of the set of CRC bits based on the second subset of reference signal bits and the set of data bits, and may mask the subset of the set of CRC bits using the first subset of reference signal bits. For example, base station 105-d may retrieve a bit string based on the first subset of reference signal bits, and may combine the subset of the set of CRC bits with the bit string using an XOR function. Base station 105-d may append the set of CRC bits to the data bits.

Calculating the set of CRC bits may further include base station 105-d receiving configuration signaling indicating a CRC configuration for calculating the set of CRC bits. Additionally, base station 105-d may switch from a first CRC configuration for calculating the set of CRC bits to a second CRC configuration for calculating the set of CRC bits. In one aspect, this switch may be based on a size of the set of reference signal bits, a size of the set of data bits, a size of the set of CRC bits, or some combination of these sizes.

At 720, base station 105-d may transmit the DMRS transmission and the data transmission with the set of CRC bits to UE 115-d. In one aspect, base station 105-d may transmit the first subset of reference signal bits in the DMRS transmission and the second subset of reference signal bits in the data transmission. Base station 105-d may transmit the data transmission using a physical data channel, and may transmit the DMRS transmission using resources reserved for DMRS transmissions. The DMRS transmission may convey phase reference information associated with the physical data channel.

At 725, UE 115-d may detect the set of reference bits associated with the DMRS transmission. At 730, UE 115-d may decode the set of data bits associated with the data transmission. Additionally, UE 115-d may receive the set of CRC bits with the data transmission.

At 735, UE 115-d may perform a CRC verification process based on the set of CRC bits. UE 115-d may determine whether or not the CRC verification is successful based on the detected set of reference signal bits and the decoded set of data bits.

Figure 8:
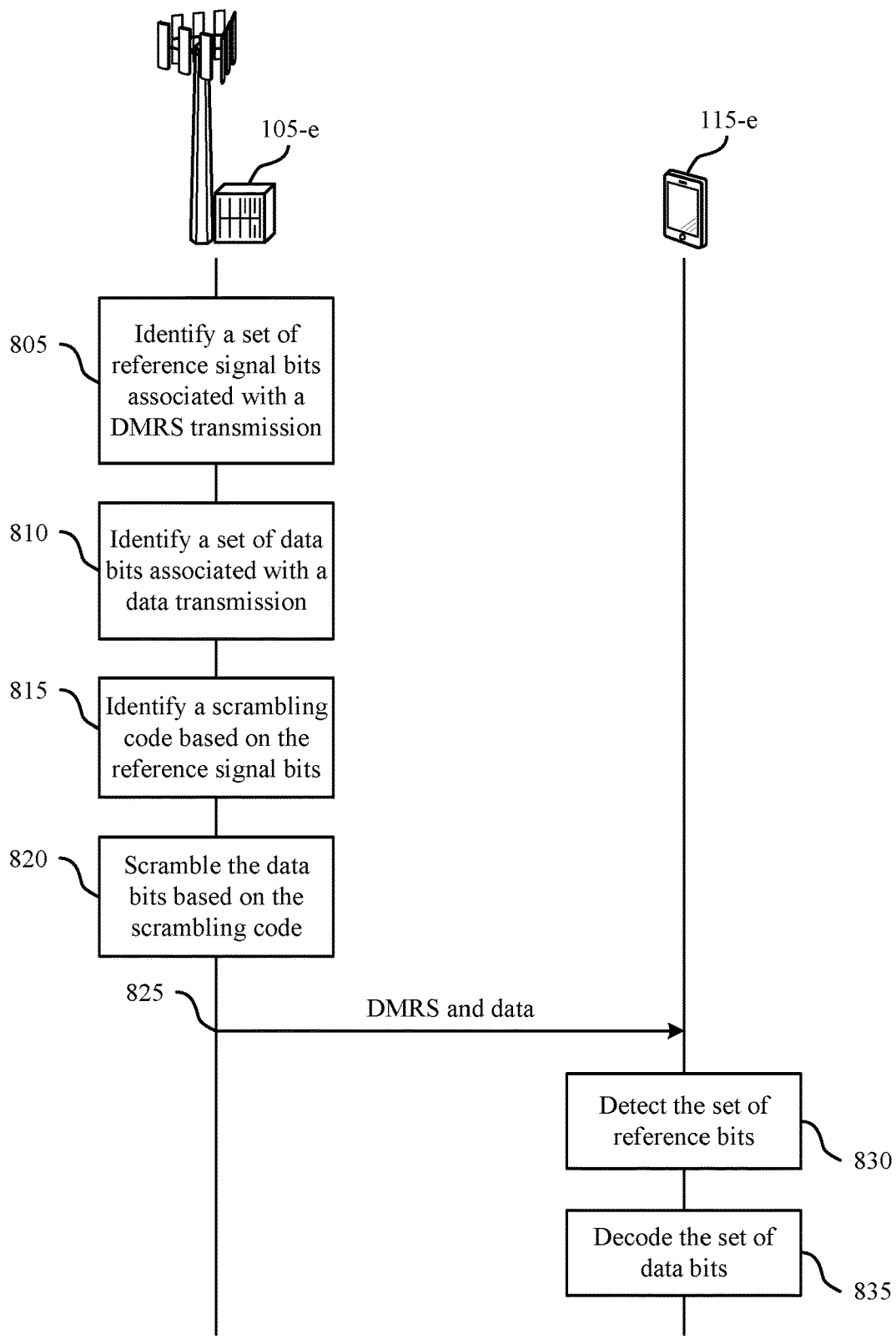

FIG. 8 illustrates an example of a process flow 800 that supports providing protection for information delivered in DMRS in accordance with various aspects of the present disclosure. The process flow 800 may include a base station 105-e and UE 115-e, which may be examples of the corresponding devices described with reference to FIGS. 1 and 2. The process flow 800 may illustrate a DMRS transmission on the downlink, but the same processes may apply to uplink DMRS transmissions as well.

At 805, the transmitting device (e.g., in this example, base station 105-e) may identify a set of reference signal bits associated with a DMRS transmission. At 810, base station 105-e may identify a set of data bits associated with a data transmission. In one aspect, base station 105-e may identify the set of data bits before or at the same time as the set of reference signal bits.

At 815, base station 105-e may identify a scrambling code based on the reference signal bits. At 820, base station 105-e may scramble the data bits based on the identified scrambling code. In some examples, base station 105-e may additionally calculate a set of CRC bits based on the reference signal bits and the data bits.

At 825, base station 105-e may transmit the DMRS transmission and the data transmission to UE 115-e. For example, base station 105-e may transmit the data transmission using a physical data channel, and may transmit the DMRS transmission using resources reserved for DMRS transmissions. The DMRS transmission may include an indication of a phase reference associated with the physical data channel.

At 830, UE 115-e may detect the set of reference bits associated with the DMRS transmission. At 835, UE 115-e may decode the set of data bits. UE 115-e may determine the scrambling code based on the detected set of reference bits, and may decode the set of data bits based on un-scrambling the bits using the determined scrambling code.

Figure 9:
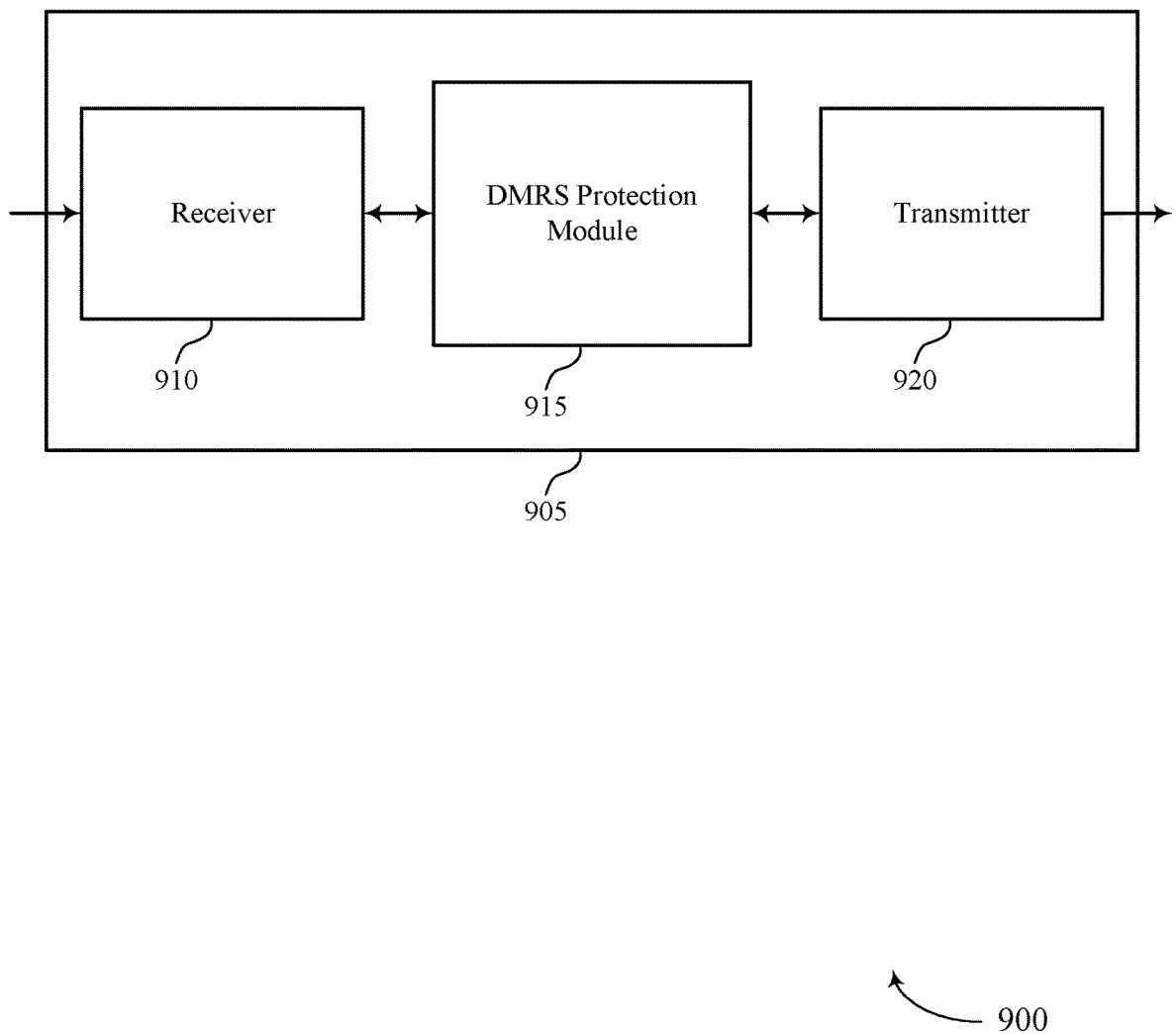
FIGS. 9 through 11 show block diagrams of a device that supports providing protection for information delivered in DMRS in accordance with aspects of the present disclosure.

FIG. 9 shows a block diagram 900 of a wireless device 905 that supports providing protection for information delivered in DMRS in accordance with aspects of the present disclosure. Wireless device 905 may be an example of aspects of a UE 115 or base station 105 as described herein. Wireless device 905 may include receiver 910, DMRS protection module 915, and transmitter 920. Wireless device 905 may also include a processor. Each of these components may be in communication with one another (e.g., via one or more buses).

Receiver 910 may receive information such as packets, user data, or control information associated with various information channels (e.g., control channels, data channels, and information related to providing protection for information delivered in DMRS, etc.). Information may be passed on to other components of the device. The receiver 910 may be an example of aspects of the transceiver 1235 described with reference to FIG. 12. The receiver 910 may utilize a single antenna or a set of antennas. DMRS protection module 915 may be an example of aspects of the DMRS protection module 1215 or 1315 as described with reference to FIGS. 12 and 13.

DMRS protection module 915 and/or at least some of its various sub-components may be implemented in hardware, software executed by a processor, firmware, or any combination thereof. If implemented in software executed by a processor, the functions of the DMRS protection module 915 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The DMRS protection module 915 and/or at least some of its various sub-components may be physically located at various positions, including being distributed such that portions of functions are implemented at different physical locations by one or more physical devices. In some examples, DMRS protection module 915 and/or at least some of its various sub-components may be a separate and distinct component in accordance with various aspects of the present disclosure. In other examples, DMRS protection module 915 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

DMRS protection module 915 may identify a set of reference signal bits associated with a DMRS transmission and a set of data bits associated with a data transmission and calculate a set of CRC bits based on both the set of reference signal bits and the set of data bits. The DMRS protection module 915 may also detect a set of reference signal bits associated with a DMRS transmission, decode a set of data bits associated with a data transmission, receive a set of CRC bits with the set of data bits, and perform a CRC verification process based on the set of CRC bits, where the set of CRC bits is computed based on both the set of reference signal bits and the set of data bits. The DMRS protection module 915 may additionally identify a set of reference signal bits associated with a DMRS transmission and a set of data bits associated with a data transmission, identify a scrambling code based on the set of reference signal bits, and scramble the set of data bits based on the identified scrambling code.

Transmitter 920 may transmit signals generated by other components of the device. Transmitter 920 may transmit the DMRS transmission and the data transmission with the set of CRC bits. In some examples, the transmitter 920 may be collocated with a receiver 910 in a transceiver module. For example, the transmitter 920 may be an example of aspects of the transceiver 1235 described with reference to FIG. 12. The transmitter 920 may utilize a single antenna or a set of antennas.

Figure 10:
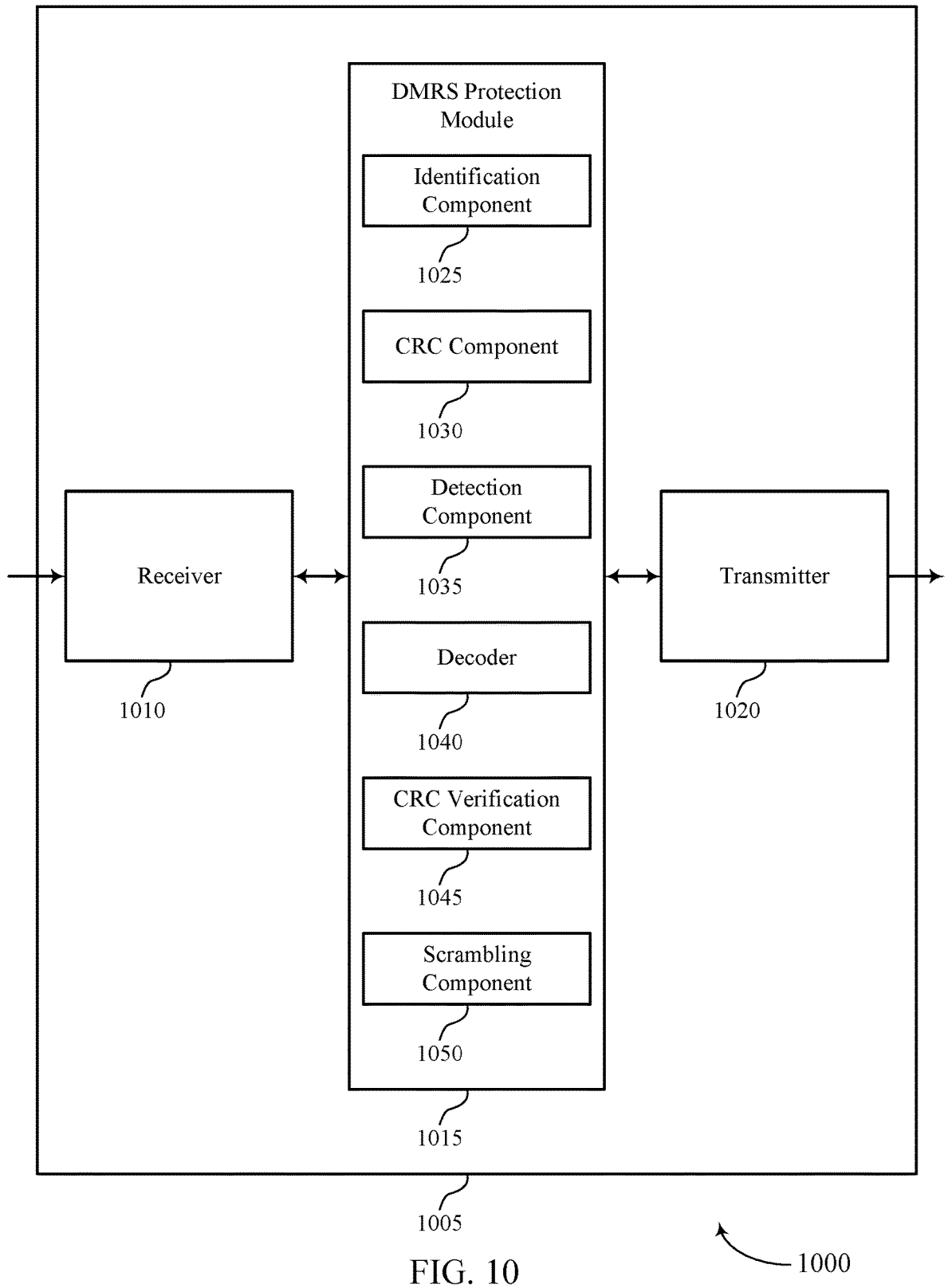

FIG. 10 shows a block diagram 1000 of a wireless device 1005 that supports providing protection for information delivered in DMRS in accordance with aspects of the present disclosure. Wireless device 1005 may be an example of aspects of a wireless device 905 or a UE 115 or base station 105 as described with reference to FIG. 9. Wireless device 1005 may include receiver 1010, DMRS protection module 1015, and transmitter 1020. Wireless device 1005 may also include a processor. Each of these components may be in communication with one another (e.g., via one or more buses).

Receiver 1010 may receive information such as packets, user data, or control information associated with various information channels (e.g., control channels, data channels, and information related to providing protection for information delivered in DMRS, etc.). Information may be passed on to other components of the device. The receiver 1010 may be an example of aspects of the transceiver 1235 described with reference to FIG. 12. The receiver 1010 may utilize a single antenna or a set of antennas.

DMRS protection module 1015 may be an example of aspects of the DMRS protection module 1215 or 1315 described with reference to FIGS. 12 and 13. DMRS protection module 1015 may also include identification component 1025, CRC component 1030, detection component 1035, decoder 1040, CRC verification component 1045, and scrambling component 1050.

Identification component 1025 may identify a set of reference signal bits associated with a DMRS transmission and a set of data bits associated with a data transmission. In one aspect, the set of reference signal bits includes a first subset of reference signal bits that are conveyed with the DMRS transmission and a second subset of reference signal bits that are conveyed with the data transmission.

CRC component 1030 may calculate a set of CRC bits based on both the set of reference signal bits and the set of data bits. In one aspect, CRC component 1030 may calculate a subset of the set of CRC bits based on the second subset of reference signal bits and the set of data bits. In some examples, the set of CRC bits are calculated based on the first subset of reference signal bits, the second subset of reference signal bits, and the set of data bits.

Detection component 1035 may detect a set of reference signal bits associated with a DMRS transmission. Decoder 1040 may decode a set of data bits associated with a data transmission.

CRC verification component 1045 may receive a set of CRC bits with the set of data bits, and perform a CRC verification process based on the set of CRC bits, where the set of CRC bits is computed based on both the set of reference signal bits and the set of data bits. CRC verification component 1045 may additionally determine whether the CRC verification process is successful.

Scrambling component 1050 may identify a scrambling code based on the set of reference signal bits and scramble the set of data bits based on the identified scrambling code.

Transmitter 1020 may transmit signals generated by other components of the device. Transmitter 1020 may transmit the DMRS transmission and the data transmission with the set of CRC bits. Transmitter 1020 may transmit the first subset of reference signal bits in the DMRS transmission and the second subset of reference signal bits in the data transmission. In some examples, transmitter 1020 may transmit the data transmission in a physical data channel, and may transmit the DMRS transmission using resources reserved for DMRS transmissions. The DMRS transmission may convey phase reference information associated with the physical data channel. In some examples, the transmitter 1020 may be collocated with a receiver 1010 in a transceiver module. For example, the transmitter 1020 may be an example of aspects of the transceiver 1235 described with reference to FIG. 12. The transmitter 1020 may utilize a single antenna or a set of antennas.

Figure 11:
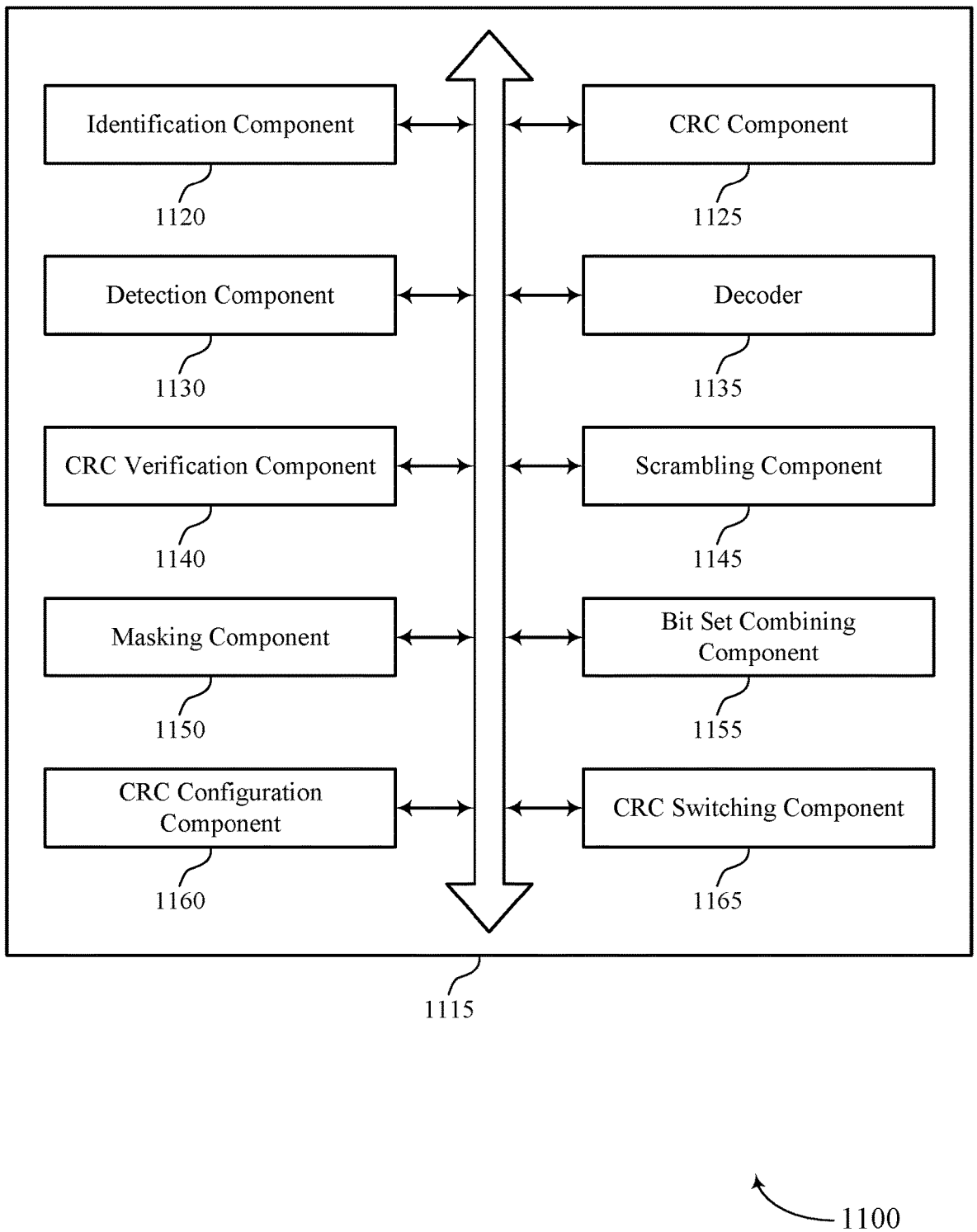

FIG. 11 shows a block diagram 1100 of a DMRS protection module 1115 that supports providing protection for information delivered in DMRS in accordance with aspects of the present disclosure. The DMRS protection module 1115 may be an example of aspects of a DMRS protection module 915, a DMRS protection module 1015, or a DMRS protection module 1215 described with reference to FIGS. 9, 10, 12, and 13. The DMRS protection module 1115 may include identification component 1120, CRC component 1125, detection component 1130, decoder 1135, CRC verification component 1140, scrambling component 1145, masking component 1150, bit set combining component 1155, CRC configuration component 1160, and CRC switching component 1165. Each of these modules may communicate, directly or indirectly, with one another (e.g., via one or more buses).

Identification component 1120 may identify a set of reference signal bits associated with a DMRS transmission and a set of data bits associated with a data transmission. In one aspect, the set of reference signal bits includes a first subset of reference signal bits that are conveyed with the DMRS transmission and a second subset of reference signal bits that are conveyed with the data transmission.

CRC component 1125 may calculate a set of CRC bits based on both the set of reference signal bits and the set of data bits and calculate a subset of the set of CRC bits based on the second subset of reference signal bits and the set of data bits. In some examples, the set of CRC bits are calculated based on the first subset of reference signal bits, the second subset of reference signal bits, and the set of data bits.

Detection component 1130 may detect a set of reference signal bits associated with a DMRS transmission. In some cases, detection component 1130 may detect a set of reference signal bits associated with a DMRS transmission and a set of data bits associated with a data transmission. Decoder 1135 may decode a set of data bits associated with a data transmission.

CRC verification component 1140 may receive a set of CRC bits with the set of data bits, and may perform a CRC verification process based on the set of CRC bits, where the set of CRC bits is computed based on both the set of reference signal bits and the set of data bits. Additionally, CRC verification component 1140 may determine whether the CRC verification process is successful.

Scrambling component 1145 may identify a scrambling code based on the set of reference signal bits and scramble the set of data bits based on the identified scrambling code. Additionally, scrambling component 1145 may identify a scrambling code based on the set of reference signal bits and descramble the set of data bits based on the identified scrambling code.

Masking component 1150 may mask the subset of the set of CRC bits by the first subset of reference signal bits. Masking component 1150 may retrieve a bit string based on the first subset of reference signal bits and combine the subset of the set of CRC bits with the bit string using an XOR function.

Bit set combining component 1155 may append the set of CRC bits to the set of data bits. CRC configuration component 1160 may receive configuration signaling indicating a CRC configuration for calculating the set of CRC bits. CRC switching component 1165 may switch from a first CRC configuration for calculating the set of CRC bits to a second CRC configuration for calculating the set of CRC bits and switch from the first CRC configuration to the second CRC configuration based on a size of the set of reference signal bits, a size of the set of data bits, a size of the set of CRC bits, or a combination thereof.

Figure 12:
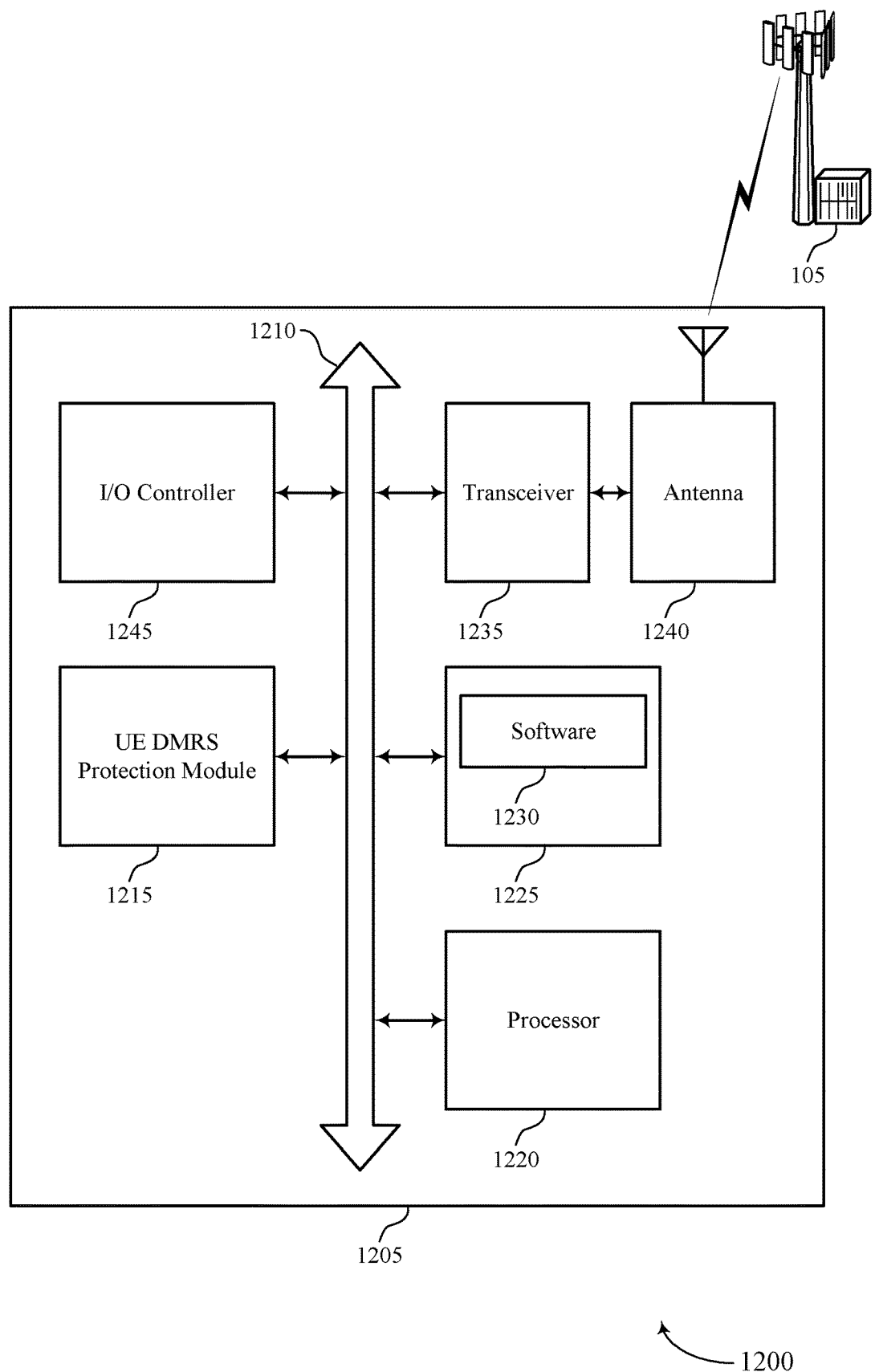
FIG. 12 illustrates a block diagram of a system including a user equipment (UE) that supports providing protection for information delivered in DMRS in accordance with aspects of the present disclosure.

FIG. 12 shows a diagram of a system 1200 including a device 1205 that supports providing protection for information delivered in DMRS in accordance with aspects of the present disclosure. Device 1205 may be an example of or include the components of wireless device 905, wireless device 1005, or a UE 115 as described above, e.g., with reference to FIGS. 1, 2, 4, 5, 9 and 10. Device 1205 may include components for bi-directional voice and data communications including components for transmitting and receiving communications, including UE DMRS protection module 1215, processor 1220, memory 1225, software 1230, transceiver 1235, antenna 1240, and I/O controller 1245. These components may be in electronic communication via one or more buses (e.g., bus 1210). Device 1205 may communicate wirelessly with one or more base stations 105.

Processor 1220 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In one aspect, processor 1220 may be configured to operate a memory array using a memory controller. In another aspect, a memory controller may be integrated into processor 1220. Processor 1220 may be configured to execute computer-readable instructions stored in a memory to perform various functions (e.g., functions or tasks supporting providing protection for information delivered in DMRS).

Memory 1225 may include random access memory (RAM) and read only memory (ROM). The memory 1225 may store computer-readable, computer-executable software 1230 including instructions that, when executed, cause the processor to perform various functions described herein. In some examples, the memory 1225 may contain, among other things, a basic input/output system (BIOS) which may control basic hardware or software operation such as the interaction with peripheral components or devices.

Software 1230 may include code to implement aspects of the present disclosure, including code to support providing protection for information delivered in DMRS. Software 1230 may be stored in a non-transitory computer-readable medium such as system memory or other memory. In one aspect, the software 1230 may not be directly executable by the processor but may cause a computer (e.g., when compiled and executed) to perform functions described herein.

Transceiver 1235 may communicate bi-directionally, via one or more antennas, wired, or wireless links as described above. For example, the transceiver 1235 may represent a wireless transceiver and may communicate bi-directionally with another wireless transceiver. The transceiver 1235 may also include a modem to modulate the packets and provide the modulated packets to the antennas for transmission, and to demodulate packets received from the antennas.

In one aspect, the wireless device may include a single antenna 1240. However, in another aspect, the device may have more than one antenna 1240, which may be capable of concurrently transmitting or receiving multiple wireless transmissions.

I/O controller 1245 may manage input and output signals for device 1205. I/O controller 1245 may also manage peripherals not integrated into device 1205. In some examples, I/O controller 1245 may represent a physical connection or port to an external peripheral. In some examples, I/O controller 1245 may utilize an operating system such as iOS®, ANDROID®, MS-DOS®, MS-WINDOWS®, OS/2®, UNIX®, LINUX®, or another known operating system. I/O controller 1245 may represent or interact with a modem, a keyboard, a mouse, a touchscreen, or a similar device. In one aspect, I/O controller 1245 may be implemented as part of a processor. In some examples, a user may interact with device 1205 via I/O controller 1245 or via hardware components controlled by I/O controller 1245.

Figure 13:
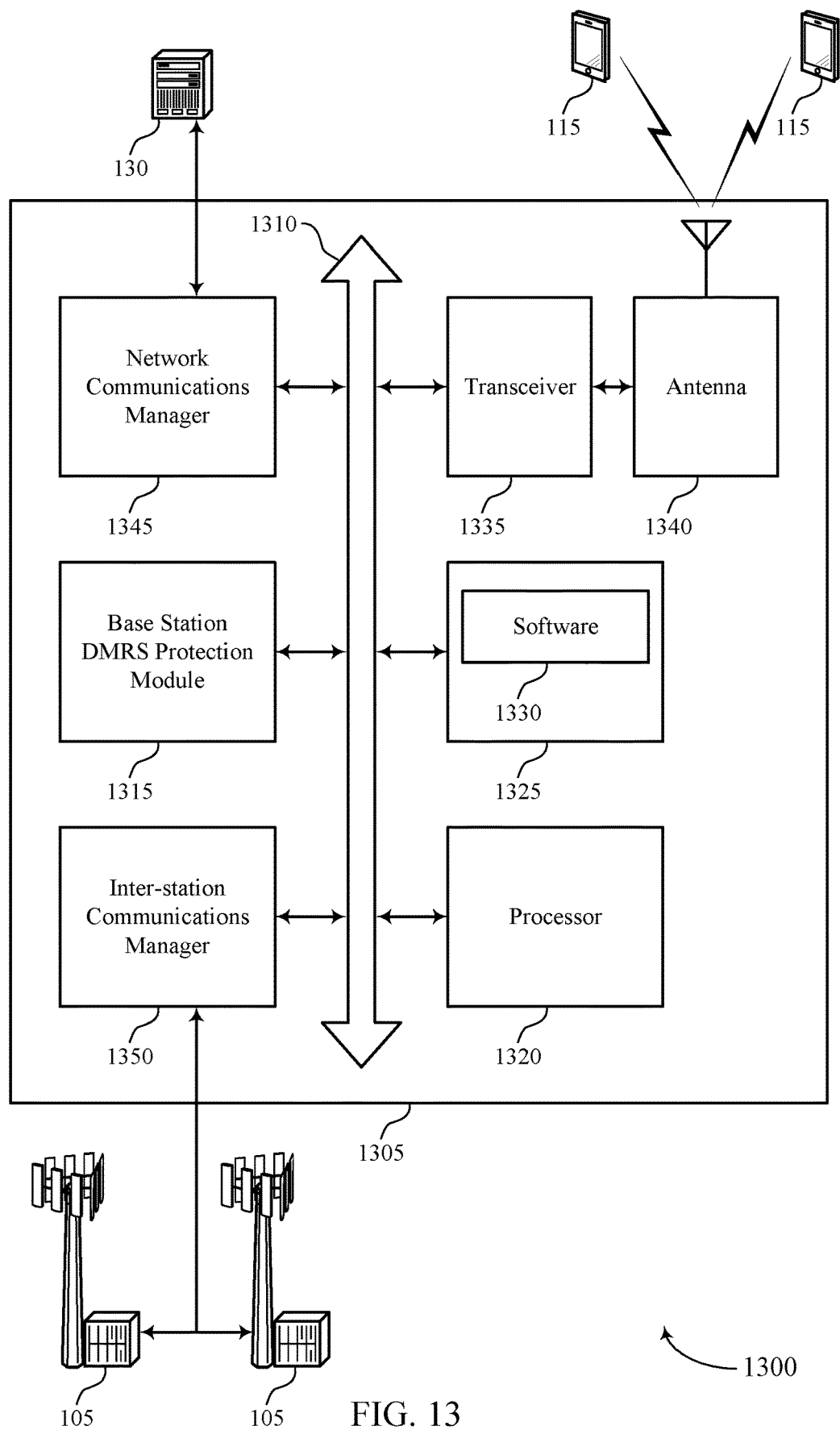
FIG. 13 illustrates a block diagram of a system including a base station that supports providing protection for information delivered in DMRS in accordance with aspects of the present disclosure.

FIG. 13 shows a diagram of a system 1300 including a device 1305 that supports providing protection for information delivered in DMRS in accordance with aspects of the present disclosure. Device 1305 may be an example of or include the components of wireless device 905, wireless device 1005, or a base station 105 as described above, e.g., with reference to FIGS. 1, 2, 4, 5, 9, and 10. Device 1305 may include components for bi-directional voice and data communications including components for transmitting and receiving communications, including base station DMRS protection module 1315, processor 1320, memory 1325, software 1330, transceiver 1335, antenna 1340, network communications manager 1345, and inter-station communications manager 1350. These components may be in electronic communication via one or more buses (e.g., bus 1310). Device 1305 may communicate wirelessly with one or more UEs 115.

Processor 1320 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In one aspect, processor 1320 may be configured to operate a memory array using a memory controller. In another aspect, a memory controller may be integrated into processor 1320. Processor 1320 may be configured to execute computer-readable instructions stored in a memory to perform various functions (e.g., functions or tasks supporting providing protection for information delivered in DMRS).

Memory 1325 may include RAM and ROM. The memory 1325 may store computer-readable, computer-executable software 1330 including instructions that, when executed, cause the processor to perform various functions described herein. In some examples, the memory 1325 may contain, among other things, a BIOS which may control basic hardware or software operation such as the interaction with peripheral components or devices.

Software 1330 may include code to implement aspects of the present disclosure, including code to support providing protection for information delivered in DMRS. Software 1330 may be stored in a non-transitory computer-readable medium such as system memory or other memory. In one aspect, the software 1330 may not be directly executable by the processor but may cause a computer (e.g., when compiled and executed) to perform functions described herein.

Transceiver 1335 may communicate bi-directionally, via one or more antennas, wired, or wireless links as described above. For example, the transceiver 1335 may represent a wireless transceiver and may communicate bi-directionally with another wireless transceiver. The transceiver 1335 may also include a modem to modulate the packets and provide the modulated packets to the antennas for transmission, and to demodulate packets received from the antennas.

In one aspect, the wireless device may include a single antenna 1340. However, in another aspect, the device may have more than one antenna 1340, which may be capable of concurrently transmitting or receiving multiple wireless transmissions.

Network communications manager 1345 may manage communications with the core network (e.g., via one or more wired backhaul links). For example, the network communications manager 1345 may manage the transfer of data communications for client devices, such as one or more UEs 115.

Inter-station communications manager 1350 may manage communications with other base station 105, and may include a controller or scheduler for controlling communications with UEs 115 in cooperation with other base stations 105. For example, the inter-station communications manager 1350 may coordinate scheduling for transmissions to UEs 115 for various interference mitigation techniques such as beamforming or joint transmission. In some examples, inter-station communications manager 1350 may provide an X2 interface within an Long Term Evolution (LTE)/LTE-A wireless communication network technology to provide communication between base stations 105.

Figure 14:
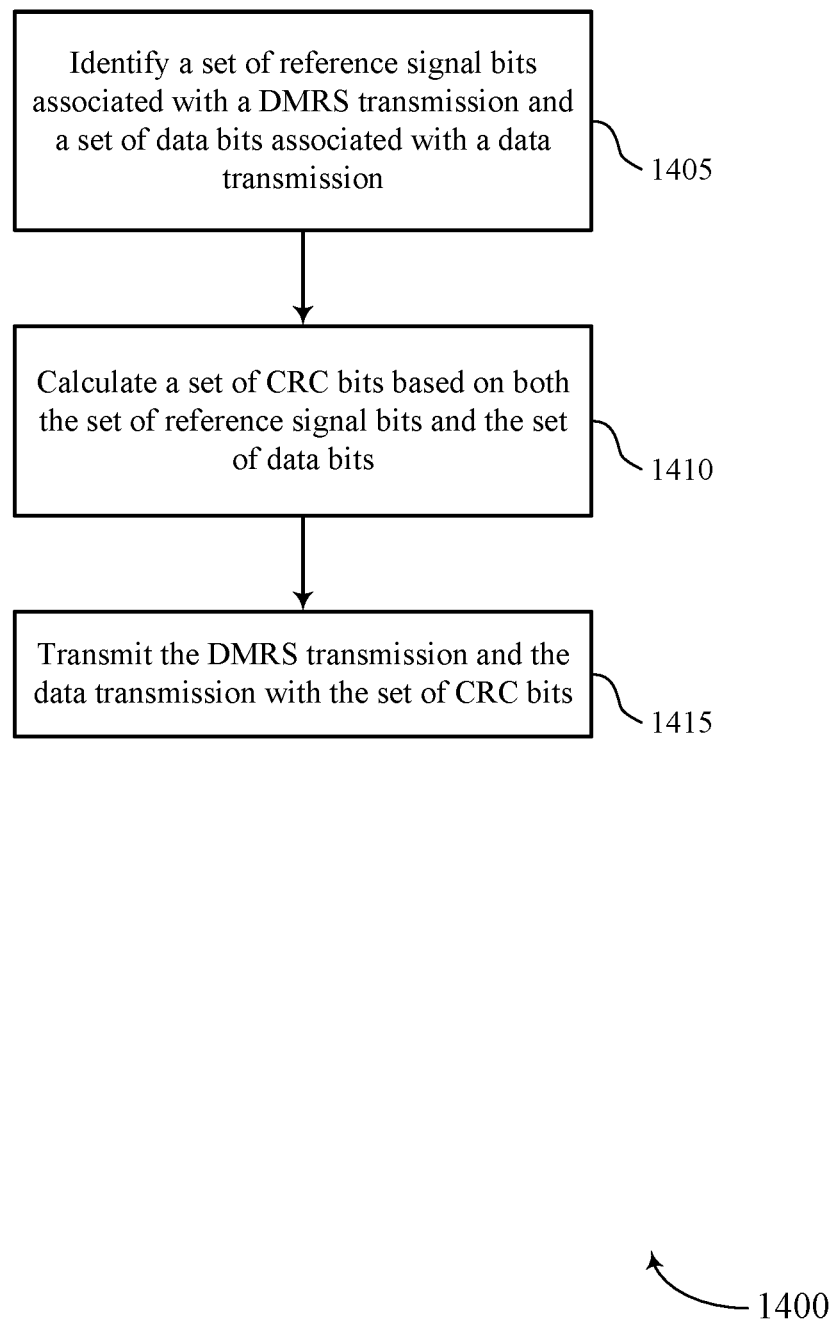
FIGS. 14 through 19 illustrate methods for providing protection for information delivered in DMRS in accordance with aspects of the present disclosure.

FIG. 14 shows a flowchart illustrating a method 1400 for providing protection for information delivered in DMRS in accordance with aspects of the present disclosure. The operations of method 1400 may be implemented by a UE 115 or base station 105 or its components as described herein. For example, the operations of method 1400 may be performed by a DMRS protection module as described with reference to FIGS. 9 through 12. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1405 the UE 115 or base station 105 may identify a set of reference signal bits associated with a DMRS transmission and a set of data bits associated with a data transmission. The operations of block 1405 may be performed according to the methods described herein. In certain examples, aspects of the operations of block 1405 may be performed by an identification component as described with reference to FIGS. 9 through 12.

At block 1410 the UE 115 or base station 105 may calculate a set of CRC bits based at least in part on both the set of reference signal bits and the set of data bits. The operations of block 1410 may be performed according to the methods described herein. In certain examples, aspects of the operations of block 1410 may be performed by a CRC component as described with reference to FIGS. 9 through 12.

At block 1415 the UE 115 or base station 105 may transmit the DMRS transmission and the data transmission with the set of CRC bits. The operations of block 1415 may be performed according to the methods described herein. In certain examples, aspects of the operations of block 1415 may be performed by a transmitter as described with reference to FIGS. 9 through 12.

Figure 15:
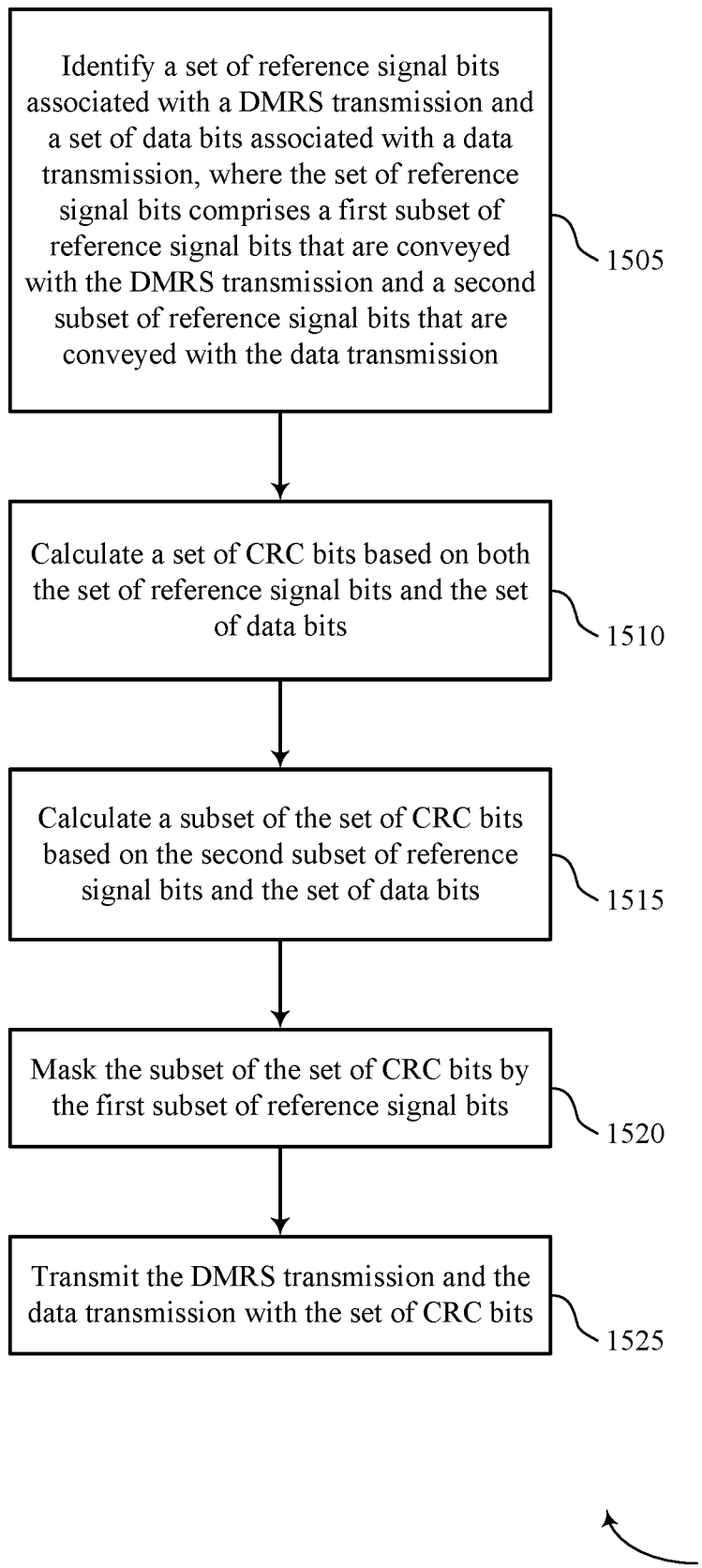

FIG. 15 shows a flowchart illustrating a method 1500 for providing protection for information delivered in DMRS in accordance with aspects of the present disclosure. The operations of method 1500 may be implemented by a UE 115 or base station 105 or its components as described herein. For example, the operations of method 1500 may be performed by a DMRS protection module as described with reference to FIGS. 9 through 12. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1505 the UE 115 or base station 105 may identify a set of reference signal bits associated with a DMRS transmission and a set of data bits associated with a data transmission. In some examples, the set of reference signal bits comprises a first subset of reference signal bits that are conveyed with the DMRS transmission and a second subset of reference signal bits that are conveyed with the data transmission. The operations of block 1505 may be performed according to the methods described herein. In certain examples, aspects of the operations of block 1505 may be performed by an identification component as described with reference to FIGS. 9 through 12.

At block 1510 the UE 115 or base station 105 may calculate a set of CRC bits based at least in part on both the set of reference signal bits and the set of data bits. The operations of block 1515 may be performed according to the methods described herein. In certain examples, aspects of the operations of block 1515 may be performed by a CRC component as described with reference to FIGS. 9 through 12.

At block 1515 the UE 115 or base station 105 may calculate a subset of the set of CRC bits based at least in part on the second subset of reference signal bits and the set of data bits. The operations of block 1520 may be performed according to the methods described herein. In certain examples, aspects of the operations of block 1520 may be performed by a CRC component as described with reference to FIGS. 9 through 12.

At block 1520 the UE 115 or base station 105 may mask the subset of the set of CRC bits by the first subset of reference signal bits. The operations of block 1525 may be performed according to the methods described herein. In certain examples, aspects of the operations of block 1525 may be performed by a masking component as described with reference to FIGS. 9 through 12.

At block 1525 the UE 115 or base station 105 may transmit the DMRS transmission and the data transmission with the set of CRC bits. The operations of block 1530 may be performed according to the methods described herein. In certain examples, aspects of the operations of block 1530 may be performed by a transmitter as described with reference to FIGS. 9 through 12.

Figure 16:
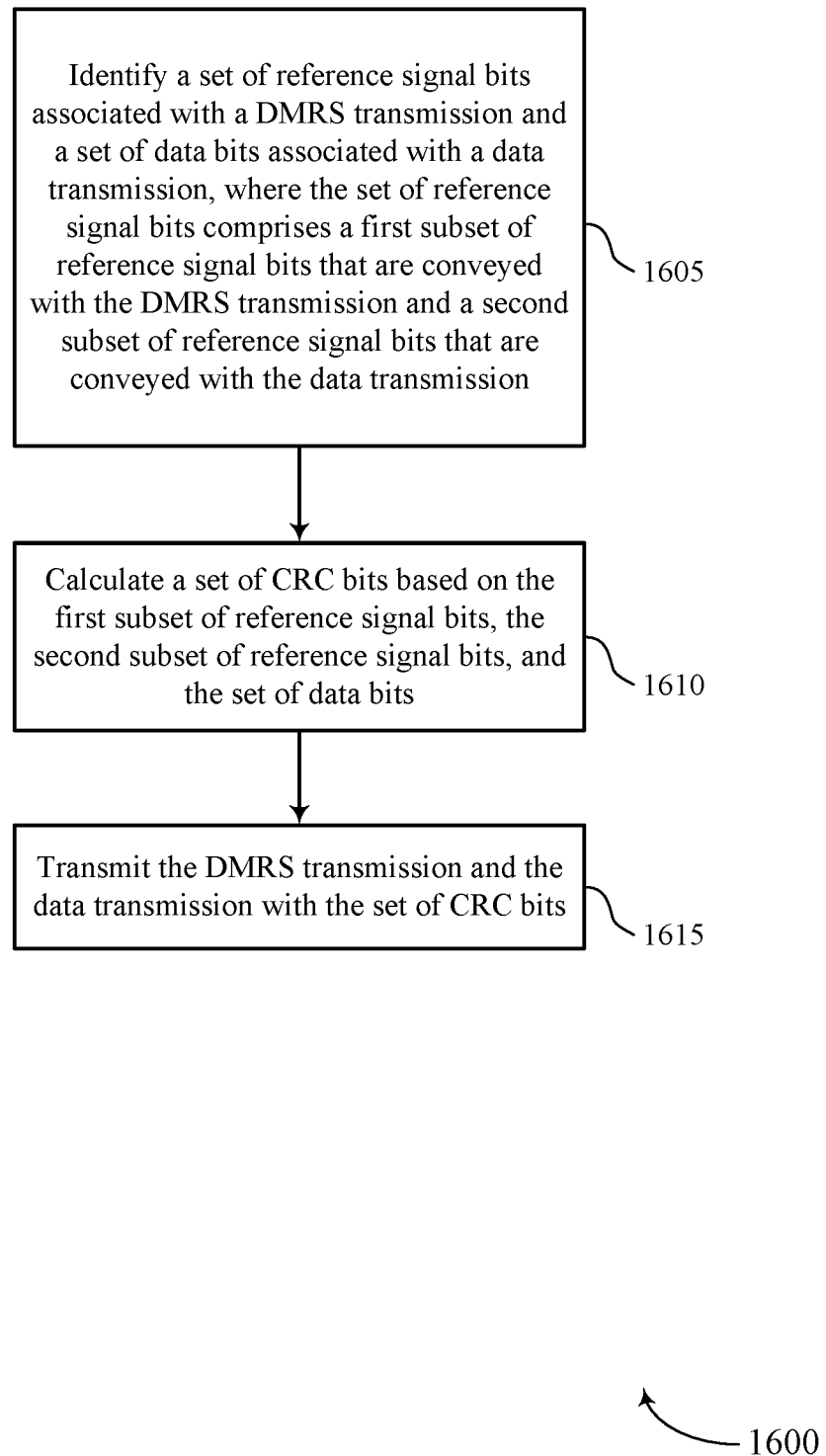

FIG. 16 shows a flowchart illustrating a method 1600 for providing protection for information delivered in DMRS in accordance with aspects of the present disclosure. The operations of method 1600 may be implemented by a UE 115 or base station 105 or its components as described herein. For example, the operations of method 1600 may be performed by a DMRS protection module as described with reference to FIGS. 9 through 12. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1605 the UE 115 or base station 105 may identify a set of reference signal bits associated with a DMRS transmission and a set of data bits associated with a data transmission. In some examples, the set of reference signal bits comprises a first subset of reference signal bits that are conveyed with the DMRS transmission and a second subset of reference signal bits that are conveyed with the data transmission. The operations of block 1605 may be performed according to the methods described herein. In certain examples, aspects of the operations of block 1605 may be performed by an identification component as described with reference to FIGS. 9 through 12.

At block 1610 the UE 115 or base station 105 may calculate a set of CRC bits based at least in part on the first subset of reference signal bits, the second subset of reference bits, and the set of data bits. The operations of block 1615 may be performed according to the methods described herein. In certain examples, aspects of the operations of block 1615 may be performed by a CRC component as described with reference to FIGS. 9 through 12.

At block 1615 the UE 115 or base station 105 may transmit the DMRS transmission and the data transmission with the set of CRC bits. The operations of block 1625 may be performed according to the methods described herein. In certain examples, aspects of the operations of block 1625 may be performed by a transmitter as described with reference to FIGS. 9 through 12.

Figure 17:
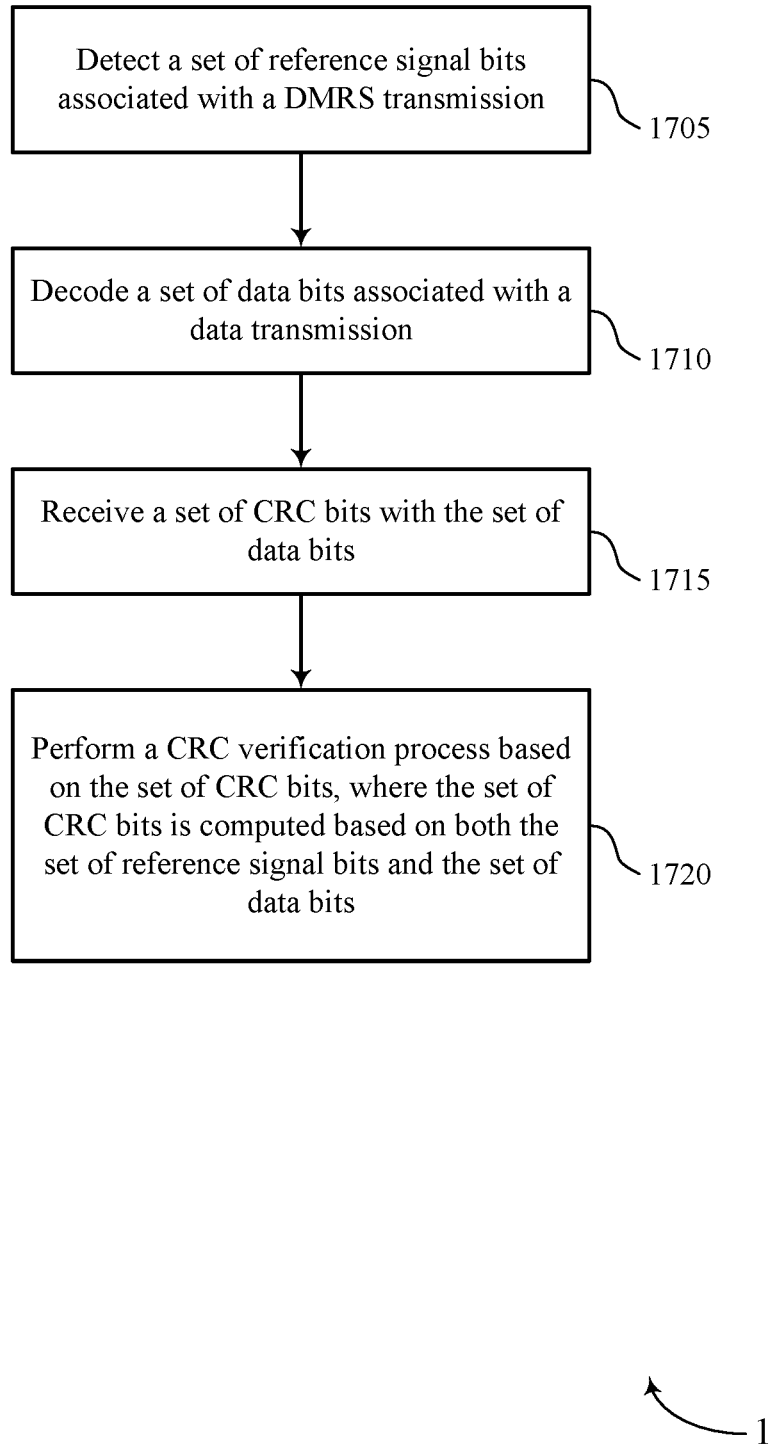

FIG. 17 shows a flowchart illustrating a method 1700 for providing protection for information delivered in DMRS in accordance with aspects of the present disclosure. The operations of method 1700 may be implemented by a UE 115 or base station 105 or its components as described herein. For example, the operations of method 1700 may be performed by a DMRS protection module as described with reference to FIGS. 9 through 12. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1705 the UE 115 or base station 105 may detect a set of reference signal bits associated with a DMRS transmission. The operations of block 1705 may be performed according to the methods described herein. In certain examples, aspects of the operations of block 1705 may be performed by a detection component as described with reference to FIGS. 9 through 12.

At block 1710 the UE 115 or base station 105 may decode a set of data bits associated with a data transmission. The operations of block 1710 may be performed according to the methods described herein. In certain examples, aspects of the operations of block 1710 may be performed by a decoder as described with reference to FIGS. 9 through 12.

At block 1715 the UE 115 or base station 105 may receive a set of CRC bits with the set of data bits. The operations of block 1715 may be performed according to the methods described herein. In certain examples, aspects of the operations of block 1715 may be performed by a CRC verification component as described with reference to FIGS. 9 through 12.

At block 1720 the UE 115 or base station 105 may perform a CRC verification process based at least in part on the set of CRC bits, wherein the set of CRC bits is computed based at least in part on both the set of reference signal bits and the set of data bits. The operations of block 1720 may be performed according to the methods described herein. In certain examples, aspects of the operations of block 1720 may be performed by a CRC verification component as described with reference to FIGS. 9 through 12.

Figure 18:
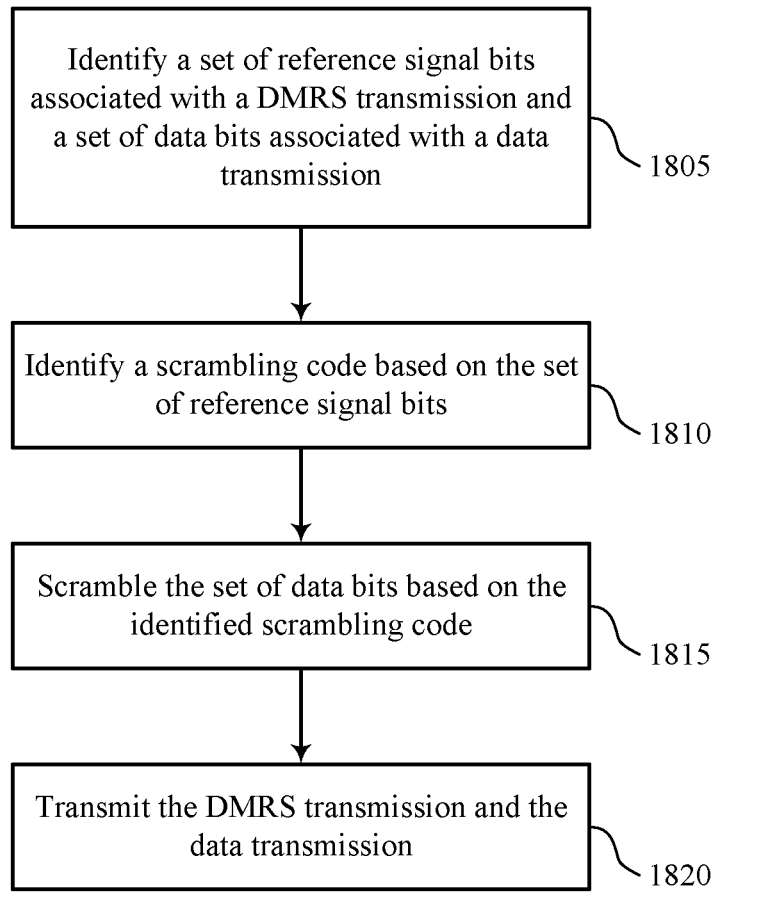

FIG. 18 shows a flowchart illustrating a method 1800 for providing protection for information delivered in DMRS in accordance with aspects of the present disclosure. The operations of method 1800 may be implemented by a UE 115 or base station 105 or its components as described herein. For example, the operations of method 1800 may be performed by a DMRS protection module as described with reference to FIGS. 9 through 12. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1805 the UE 115 or base station 105 may identify a set of reference signal bits associated with a DMRS transmission and a set of data bits associated with a data transmission. The operations of block 1805 may be performed according to the methods described herein. In certain examples, aspects of the operations of block 1805 may be performed by an identification component as described with reference to FIGS. 9 through 12.

At block 1810 the UE 115 or base station 105 may identify a scrambling code based at least in part on the set of reference signal bits. The operations of block 1810 may be performed according to the methods described herein. In certain examples, aspects of the operations of block 1810 may be performed by a scrambling component as described with reference to FIGS. 9 through 12.

At block 1815 the UE 115 or base station 105 may scramble the set of data bits based at least in part on the identified scrambling code. The operations of block 1815 may be performed according to the methods described herein. In certain examples, aspects of the operations of block 1815 may be performed by a scrambling component as described with reference to FIGS. 9 through 12.

At block 1820 the UE 115 or base station 105 may transmit the DMRS transmission and the data transmission. The operations of block 1820 may be performed according to the methods described herein. In certain examples, aspects of the operations of block 1820 may be performed by a transmitter as described with reference to FIGS. 9 through 12.

Figure 19:
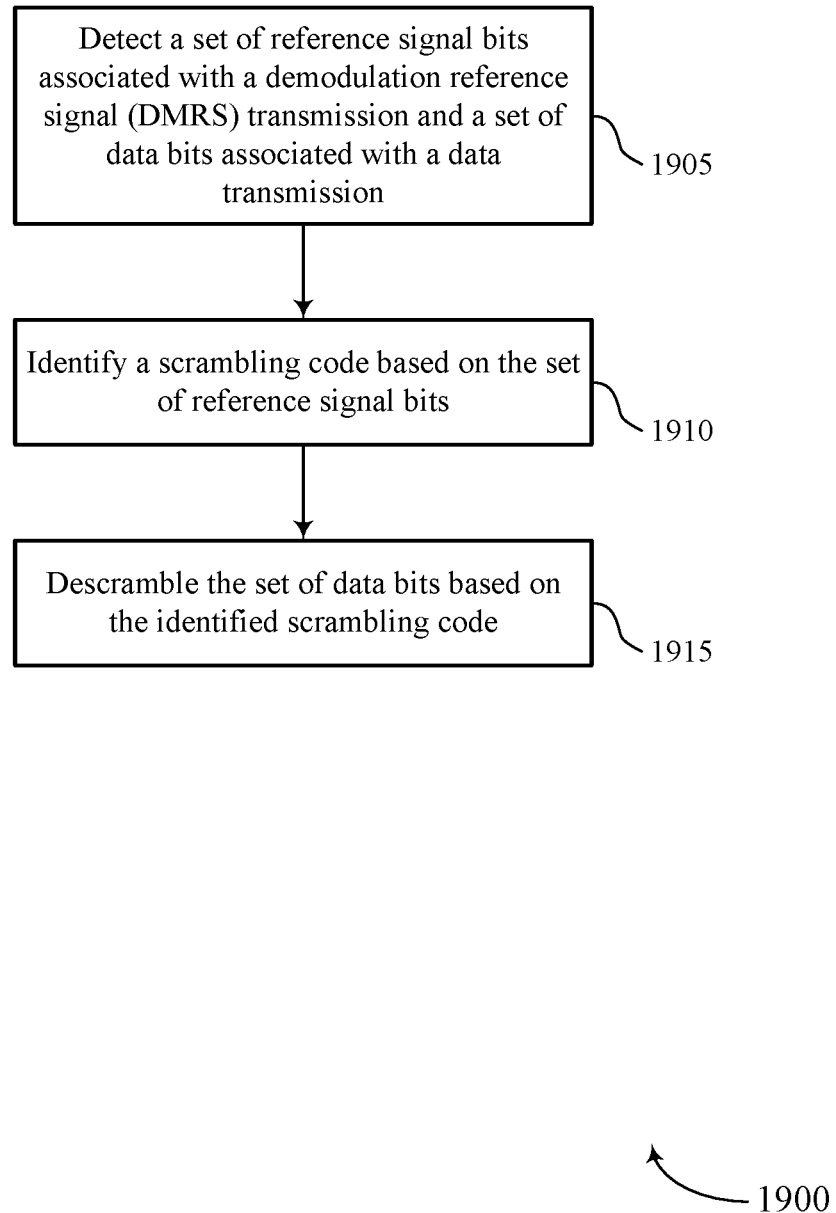

FIG. 19 shows a flowchart illustrating a method 1900 for providing protection for information delivered in DMRS in accordance with aspects of the present disclosure. The operations of method 1900 may be implemented by a default or its components as described herein. For example, the operations of method 1900 may be performed by a DMRS protection module as described with reference to FIGS. 9 through 12. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At 1905, the UE 115 or base station 105 may detect a set of reference signal bits associated with a DMRS transmission and a set of data bits associated with a data transmission. The operations of 1905 may be performed according to the methods described herein. In some examples, aspects of the operations of 1905 may be performed by a detection component as described with reference to FIGS. 9 through 12.

At 1910, the UE 115 or base station 105 may identify a scrambling code based on the set of reference signal bits. The operations of 1910 may be performed according to the methods described herein. In some examples, aspects of the operations of 1910 may be performed by a scrambling component as described with reference to FIGS. 9 through 12.

At 1915, the UE 115 or base station 105 may descramble the set of data bits based on the identified scrambling code. The operations of 1915 may be performed according to the methods described herein. In some examples, aspects of the operations of 1915 may be performed by a scrambling component as described with reference to FIGS. 9 through 12. In some cases, the UE 115 or base station 105 may fail when scrambling the set of data bits when the identified scrambling code is incorrect. For example, when a UE 115 incorrectly decodes the DMRS, the decoding of the data channel would automatically fail.

It should be noted that the methods described above describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
    detecting a set of reference signal bits associated with a demodulation reference signal (DMRS) transmission and a set of data bits associated with a data transmission on a physical data channel, wherein the set of reference signal bits comprise a timing indication of the physical data channel;
    identifying a scrambling code for the set of data bits based at least in part on the set of reference signal bits; and
    descrambling the set of data bits based at least in part on the identified scrambling code.

2. The method of claim 1, wherein the data transmission is transmitted using a physical broadcast channel (PBCH), and wherein the DMRS transmission is associated with the PBCH.

3. The method of claim 1, further comprising:
    performing a cyclic redundancy check (CRC) verification process based at least in part on a set of CRC bits, wherein the set of CRC bits is computed based at least in part on both the set of reference signal bits and the set of data bits.

4. A method for wireless communication, comprising:
    identifying a set of reference signal bits associated with a demodulation reference signal (DMRS) transmission and a set of data bits associated with a data transmission on a physical data channel, wherein the set of reference signal bits comprise a timing indication of the physical data channel;
    identifying a scrambling code for the set of data bits based at least in part on the set of reference signal bits;
    scrambling the set of data bits based at least in part on the identified scrambling code; and
    transmitting the DMRS transmission and the data transmission.

5. The method of claim 4, further comprising:
    calculating a set of cyclic redundancy check (CRC) bits based at least in part on both the set of reference signal bits and the set of data bits.

6. The method of claim 4, wherein:
    the data transmission is transmitted using a physical broadcast channel (PBCH); and
    the DMRS transmission is transmitted using resources reserved for DMRS transmissions, wherein the DMRS transmission is associated with the PBCH.

7. The method of claim 6, wherein the DMRS transmission conveys phase reference information associated with the physical data channel.

8. An apparatus for wireless communication, comprising:
means for identifying a set of reference signal bits associated with a demodulation reference signal (DMRS) transmission and a set of data bits associated with a data transmission on a physical data channel, wherein the set of reference signal bits comprise a timing indication of the physical data channel;
means for identifying a scrambling code for the set of data bits based at least in part on the set of reference signal bits;
means for scrambling the set of data bits based at least in part on the identified scrambling code; and
means for transmitting the DMRS transmission and the data transmission.

9. An apparatus for wireless communication, comprising:
a processor;
memory in electronic communication with the processor; and
instructions stored in the memory and operable, when executed by the processor, to cause the apparatus to:
identify a set of reference signal bits associated with a demodulation reference signal (DMRS) transmission and a set of data bits associated with a data transmission on a physical data channel, wherein the set of reference signal bits comprise a timing indication of the physical data channel;
identify a scrambling code for the set of data bits based at least in part on the set of reference signal bits;
scramble the set of data bits based at least in part on the identified scrambling code; and
transmit the DMRS transmission and the data transmission.

10. The apparatus of claim 9, wherein the instructions are further executable by the processor to:
calculate a set of cyclic redundancy check (CRC) bits based at least in part on both the set of reference signal bits and the set of data bits.

11. The apparatus of claim 9, wherein:
the data transmission is transmitted using a physical broadcast channel (PBCH); and
the DMRS transmission is transmitted using resources reserved for DMRS transmissions.

12. The apparatus of claim 11, wherein the DMRS transmission conveys phase reference information associated with the physical data channel.

13. A non-transitory computer readable medium storing code for wireless communication, the code comprising instructions executable by a processor to:
identify a set of reference signal bits associated with a demodulation reference signal (DMRS) transmission and a set of data bits associated with a data transmission on a physical data channel, wherein the set of reference signal bits comprise a timing indication of the physical data channel;
identify a scrambling code for the set of data bits based at least in part on the set of reference signal bits;
scramble the set of data bits based at least in part on the identified scrambling code; and
transmit the DMRS transmission and the data transmission.

* * * * *